(12) United States Patent
Hwang et al.

(10) Patent No.: US 12,471,487 B2
(45) Date of Patent: Nov. 11, 2025

(54) LIGHT-EMITTING DEVICE, METHOD OF MANUFACTURING THE SAME, AND OPERATING METHOD OF THE SAME

(71) Applicants: Samsung Electronics Co., Ltd., Suwon-si (KR); Korea Advanced Institute of Science and Technology, Daejeon (KR)

(72) Inventors: Kyuyoung Hwang, Anyang-si (KR); Muhyun Baik, Daejeon (KR); Seungyeon Kwak, Suwon-si (KR); Won-joon Son, Suwon-si (KR); Hyeonho Choi, Seoul (KR); Seoungtae Kim, Daejeon (KR); Seungyeol Baek, Daejeon (KR); Jinhoon Jeong, Daejeon (KR); Sunghan Kim, Daejeon (KR); Byoungki Choi, Seongnam-si (KR)

(73) Assignees: SAMSUNG ELECTRONICS CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 876 days.

(21) Appl. No.: 17/686,293

(22) Filed: Mar. 3, 2022

(65) Prior Publication Data

US 2022/0293880 A1    Sep. 15, 2022

(30) Foreign Application Priority Data

Mar. 4, 2021  (KR) .................. 10-2021-0029052

(51) Int. Cl.
*H10K 71/10*    (2023.01)
*H10K 50/11*    (2023.01)
(Continued)

(52) U.S. Cl.
CPC .......... *H10K 71/191* (2023.02); *H10K 50/11* (2023.02); *H10K 50/156* (2023.02);
(Continued)

(58) Field of Classification Search
CPC ................................... H10K 71/191
See application file for complete search history.

(56) References Cited

U.S. PATENT DOCUMENTS

| 5,537,000 | A | 7/1996 | Alivisatos et al. |
| 2004/0191567 | A1* | 9/2004 | Caballero .............. H10K 85/30 428/917 |

(Continued)

FOREIGN PATENT DOCUMENTS

| EP | 1901363 A1 | 3/2008 |
| JP | 2003147345 A | 5/2003 |

(Continued)

OTHER PUBLICATIONS

J. Heo, H. Ahn, J. Won, S. W. Han, M.-H. Baik, "Electro-inductive effect: Electrodes as functionalgroups with tunable electronic properties", Science 2020 370, 214-219.
(Continued)

*Primary Examiner* — Sean M DeGuire
(74) *Attorney, Agent, or Firm* — CANTOR COLBURN LLP

(57) ABSTRACT

Provided are a light-emitting device, a method of manufacturing the light-emitting device, and an operating method of the light-emitting device, wherein the light-emitting device includes a first conductive layer and a light-emitting group represented by Formula 1:

$$*-A_3-(A_1)_{m1}-(A_2)_{m2}.$$    Formula 1

The detailed description of Formula 1 is the same as described in the present specification.

18 Claims, 2 Drawing Sheets

(51) Int. Cl.
  *H10K 50/15*   (2023.01)
  *H10K 50/80*   (2023.01)
  *H10K 71/00*   (2023.01)
  *H10K 85/30*   (2023.01)

(52) U.S. Cl.
  CPC ........... *H10K 85/322* (2023.02); *H10K 50/80* (2023.02); *H10K 71/00* (2023.02)

(56) References Cited

U.S. PATENT DOCUMENTS

2017/0371219 A1   12/2017   Kobayashi et al.
2018/0033988 A1   2/2018   Walter et al.

FOREIGN PATENT DOCUMENTS

JP   2009158691 A   7/2009
JP   2010080759 A   4/2010
WO   2006126407 A1   11/2006

OTHER PUBLICATIONS

Song Guo, et al., Luminescent ion pairs with tunable emission colorsfor light-emitting devices and electrochromic switches, Chem. Sci., 2017, 8, 348-360.
Extended European Search Report, dated Jul. 15, 2022 issued in EP Patent Application No. 22159223.1, 8 pp.
Office Action issued Aug. 19, 2025, in corresponding JP Patent Application No. 2022-032581, with English Translation, 12 pp.

* cited by examiner

LIGHT-EMITTING DEVICE, METHOD OF MANUFACTURING THE SAME, AND OPERATING METHOD OF THE SAME

CROSS-REFERENCE TO RELATED APPLICATION

This application claims priority under 35 U.S.C. § 119 to Korean Patent Application No. 10-2021-0029052, filed on Mar. 4, 2021, in the Korean Intellectual Property Office, the disclosure of which is incorporated by reference herein in its entirety.

BACKGROUND

1. Field

The present disclosure relates to light-emitting devices, methods of manufacturing the light-emitting devices, and operating methods of the light-emitting devices.

2. Description of the Related Art

Recently, research on various light-emitting devices that can be used in devices such as various displays and light sources has been actively conducted. From among these devices, organic light-emitting devices are self-emissive devices, and have excellent characteristics in terms of viewing angles, response time, luminance, driving voltage, and response speed, and can produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

Meanwhile, there are needs to develop, other than these organic light-emitting devices, next-generation light-emitting devices having a structure and a light-emitting mechanism which are different from those of organic light-emitting devices.

SUMMARY

Provided are light-emitting devices, methods of manufacturing the light-emitting devices, and operating methods of light-emitting devices.

Additional aspects will be set forth in part in the description, which follows and, in part, will be apparent from the description, or may be learned by practice of the presented embodiments of the disclosure.

According to one or more embodiments, a light-emitting device includes
 a first conductive layer, and
 a light-emitting group represented by Formula 1, wherein the light-emitting group is chemically bonded to an atom on the surface of the first conductive layer.

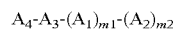  Formula 1

In Formula 1,
 * indicates a chemical binding site to an atom on the surface of the first conductive layer,
 $A_3$ is an atom bonded to an atom on the surface of the first conductive layer,
 $A_1$ is a linking group,
 $A_2$ is a light-emitting moiety, and
 m1 and m2 may each independently be an integer from 1 to 10, wherein, when m1 is 2 or more, two or more of $A_1(s)$ may be identical to or different from each other, and when m2 is 2 or more, two or more of $A_2(s)$ may be identical to each other or different from each other.

According to another aspect, provided is a method of manufacturing a light-emitting device, the method including
 providing a first conductive layer, and
 chemically bonding the light-emitting group represented by Formula 1 to an atom on the surface of the first conductive layer by bringing the first conductive layer into be in contact with a compound represented by Formula 1A.

$$A_4\text{-}A_3\text{-}(A_1)_{m1}\text{-}(A_2)_{m2}$$  Formula 1A

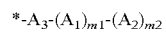  Formula 1 in Formulae 1A and 1, $A_4$ is a moiety, and *, $A_3$, $A_1$, $A_2$, m1, and m2 are the same as described above.

According to one or more embodiments, an operating method of a light-emitting device includes controlling a voltage applied to a first conductive layer of the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
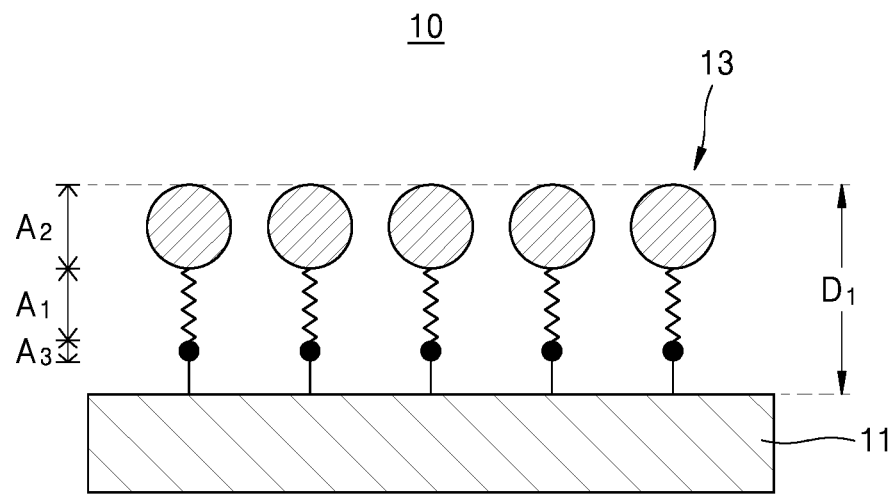
FIG. 1 shows a schematic cross-sectional view of a light-emitting device according to an exemplary embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded Thus, the regions illustrated in the figures are schematic in nature and their shapes are not intended to illustrate the precise shape of a region and are not intended to limit the scope of the present claims.

Description of FIG. 1

A light-emitting device 10 of FIG. 1 includes a first conductive layer 11 and a light-emitting group 13.

The first conductive layer 11 may include a conductive material.

In an embodiment, the first conductive layer 11 may include metal, metalloid, carbon, nitrogen, oxygen, or a combination thereof.

In an embodiment, the first conductive layer 11 may include magnesium (Mg), calcium (Ca), scandium (Sc), yttrium (Y), lanthanum (La), actinium (Ac), titanium (Ti), zirconium (Zr), hafnium (Hf), cerium (Ce), vanadium (V), niobium (Nb), tantalum (Ta), chromium (Cr), molybdenum (Mo), tungsten (W), neodymium (Nd), manganese (Mn), rhenium (Re), iron (Fe), cobalt (Co), nickel (Ni), copper (Cu), silver (Ag), gold (Au), zinc (Zn), aluminum (Al), gallium (Ga), indium (In), thallium (Tl), tin (Sn), bismuth (Bi), boron (B), silicon (Si), germanium (Ge), arsenic (As), antimony (Sb), tellurium (Te), carbon, nitrogen, oxygen, or any combination thereof.

In an embodiment, the first conductive layer 11 may include metal, metalloid, nitrogen, oxygen, or a combination thereof.

In an embodiment, the first conductive layer 11 may include metal, metalloid, oxygen, or a combination thereof.

In an embodiment, the first conductive layer 11 may include metal, metalloid, or a combination thereof as described above, and optionally, may further include oxygen.

In an embodiment, the first conductive layer 11 may include silver (Ag), gold (Au), zinc (Zn), aluminum (Al), gallium (Ga), indium (In), thallium (Tl), tin (Sn), or any combination thereof. In an embodiment, the first conductive layer 11 may be an Au layer.

In an embodiment, the first conductive layer 11 may include silver (Ag), gold (Au), zinc (Zn), aluminum (Al), gallium (Ga), indium (In), thallium (Tl), tin (Sn), or any combination thereof, and may further include oxygen. In an embodiment, the first conductive layer 11 may be an ITO layer.

The light-emitting group 13 may be chemically bonded to an atom (for example, metal, metalloid, carbon, nitrogen, oxygen, or a combination thereof) on the surface of the first conductive layer 11. This structure is clearly distinguished from a structure in which luminescent compound molecules are randomly and physically stacked on an electrode through a deposition method (for example, a vacuum deposition method, etc.) and/or a coating method (for example, spin coating method, laser printing method, etc.).

In some embodiments, a monolayer including a plurality of light-emitting groups 13 is located on the surface of the first conductive layer 11, and the monolayer including the plurality of light-emitting groups 13 may be in direct contact with the surface of the first conductive layer 11. This structure could be identified from the feature wherein the light-emitting group 13 is represented by Formula 1 below and * in Formula 1 is a chemical binding site to an atom on the surface of the first conductive layer 11.

The thickness ($D_1$) of the monolayer including the plurality of light-emitting groups 13 may vary depending on the length of the light-emitting groups 13. In an embodiment, the length of the light-emitting group 13 may be from about 0.1 nm to about 5.0 nm, or from about 0.5 nm to about 2.0 nm.

In addition to the light-emitting group 13, the monolayer including the plurality of light-emitting groups 13 may further include any group that is different from the light-emitting group 13. For example, the monolayer including the plurality of light-emitting groups 13 may further include a $A_2$-free group. The $A_2$-free group may be formed when the bond between $A_1$ and $A_2$ is broken, or $A_1$ and $A_2$ are not bonded to each other, in forming the monolayer including the plurality of light-emitting groups 13. The $A_2$-free group means a group not including $A_2$.

The monolayer including the plurality of light-emitting groups 13 may be a self-assembled monolayer. Accordingly, a self-assembled monolayer including the plurality of light-emitting groups 13 may be located in direct contact with an upper portion of the first conductive layer 11.

The light-emitting group 13 may be represented by Formula 1:

$$*\text{-}A_3\text{-}(A_1)_{m1}\text{-}(A_2)_{m2} \quad \text{Formula 1}$$

\* in Formula 1 may indicate the chemical binding site of an atom on the surface of the first conductive layer 11.

In an embodiment, * in Formula 1 may indicate a chemical binding site to metal, metalloid, carbon, nitrogen, or oxygen on the surface of the first conductive layer 11.

For example, an atom on the first conductive layer 11 (for example, an atom on the surface of the first conductive layer 11) may include metal, wherein the metal may include magnesium (Mg), calcium (Ca), scandium (Sc), yttrium (Y), lanthanum (La), actinium (Ac), titanium (Ti), zirconium (Zr), hafnium (Hf), cerium (Ce), vanadium (V), niobium (Nb), tantalum (Ta), chromium (Cr), molybdenum (Mo), tungsten (W), neodymium (Nd), manganese (Mn), rhenium (Re), iron (Fe), cobalt (Co), nickel (Ni), copper (Cu), silver (Ag), gold (Au), zinc (Zn), aluminum (Al), gallium (Ga), indium (In), thallium (Tl), tin (Sn), bismuth (Bi), or any combination thereof.

In an embodiment, the atom on the surface of the first conductive layer 11 may include metalloid, and the metalloid may include boron (B), silicon (Si), germanium (Ge), arsenic (As), antimony (Sb), tellurium (Te), or a combination thereof.

In an embodiment, the first conductive layer 11 may include silver (Ag), gold (Au), zinc (Zn), aluminum (Al), gallium (Ga), indium (In), thallium (Tl), tin (Sn), or any combination thereof, and * in Formula 1 may be a chemical binding site to silver (Ag), gold (Au), zinc (Zn), aluminum (Al), gallium (Ga), indium (In), thallium (Tl), or tin (Sn) on the surface of the first conductive layer 11.

$A_3$ in Formula 1 is an atom that fixes the light-emitting group 13 to the surface of the first conductive layer 11, and may be an atom that is bonded to the atom on the surface of the first conductive layer 11. $A_3$ may be, for example, O or S.

$A_1$ of Formula 1 is a linking group, and may connect $A_3$ and $A_2$ in Formula 1 to each other and may provide rigidity to the light-emitting group 13. For example, since $A_1$ transfers charges to $A_2$, which is a light-emitting moiety, when voltage is applied to the first conductive layer 11, $A_1$ may be selected from among groups that can provide a conjugation system with $A_2$.

For example, $A_1$ of Formula 1 may be a single bond, a substituted or unsubstituted $C_2$-$C_{60}$ alkylene group, a substituted or unsubstituted $C_2$-$C_{60}$ alkenylene group, a substituted or unsubstituted $C_2$-$C_{60}$ alkynylene group, a substituted or unsubstituted $C_5$-$C_{30}$ carbocyclic group or a substituted or unsubstituted $C_2$-$C_{30}$ heterocyclic group.

In an embodiment, $A_1$ of Formula 1 may be a single bond, a $C_2$-$C_{60}$ alkenylene group that is unsubstituted or substituted with at least one $R_{10a}$, a $C_2$-$C_{60}$ alkynylene group that is unsubstituted or substituted with at least one $R_{10a}$, a $C_5$-$C_{30}$ carbocyclic group that is unsubstituted or substituted with at least one $R_{10a}$, or a $C_2$-$C_{30}$ heterocyclic group that is unsubstituted or substituted with at least one $R_{10a}$.

$R_{10a}$ is the same as described in connection with $R_{10}$.

In an embodiment, $A_1$ of Formula 1 may be:
a single bond; or
a $C_2$-$C_{20}$ alkenylene group, a $C_2$-$C_{20}$ alkynylene group, a cyclopentane group, a cyclohexane group, a cycloheptane group, a cyclopentene group, a cyclohexene group, a cycloheptene group, an adamantane group, a norbornane group, a norbornene group, a bicyclo[1.1.1]pentane group, a bicyclo[2.1.1]hexane group, a bicyclo[2.2.2]octane group, a benzene group, a naphthalene group, an anthracene group, a phenanthrene group, a triphenylene group, a pyrene group, a chrysene group, a 1,2,3,4-tetrahydronaphthalene group, a pyrrole group, a borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group (or a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzomidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof.

$A_2$ in Formula 1 may be a luminescent moiety, a monovalent group derived from phosphorescent luminescent compounds, fluorescent luminescent compounds, or quantum dots.

$A_2$ in Formula 1 may be selected from luminescent moieties having a chemical structure in which a highest occupied molecular orbital (HOMO) of chromophore is relatively clearly separated from lowest unoccupied molecular orbital (LUMO) of chromophore in the molecule so that the maximum emission wavelength change amount of light emitted from light-emitting group 13 can be induced to a maximum value when voltage is applied to the first conductive layer 11.

The phosphorescent luminescent compounds, fluorescent luminescent compounds, and quantum dots may be any phosphorescent luminescent compounds, fluorescent luminescent compounds, or quantum dots which are located between a pair of electrodes of a light-emitting device, for example, an organic light-emitting device.

The term "a monovalent group derived from material X" used herein refers to a group in which a site of material X from which an arbitrary atom (for example, hydrogen, etc.) is removed, becomes a binding site to a neighboring atom. For example, a monovalent group derived from methane ($CH_4$) refers to a methyl group (*—$CH_3$ wherein * indicates a binding site to any other atom).

In an embodiment, $A_2$ in Formula 1 may not be a phenyl group substituted with a substituent.

In an embodiment, $A_2$ of Formula 1 may be a monovalent group derived from an organometallic compound capable of emitting phosphorescent light.

In an embodiment, the organometallic compound may include a transition metal. Thus, $A_2$ in Formula 1 may be a monovalent group derived from a transition metal-containing organometallic compound.

In an embodiment, the organometallic compound may include iridium (Ir), platinum (Pt), osmium (Os), rhodium (Rh), ruthenium (Ru), rhenium (Re), palladium (Pd), or gold (Au). Accordingly, $A_2$ of Formula 1 may be a monovalent group derived from an organometallic compound including iridium (Ir), platinum (Pt), osmium (Os), rhodium (Rh), ruthenium (Ru), rhenium (Re), palladium (Pd), or gold (Au).

The organometallic compound may further include at least one ligand bound to the transition metal in addition to the transition metal as described above. The at least one ligand may be a ligand represented by one of Formulae 2-1 to 2-4:

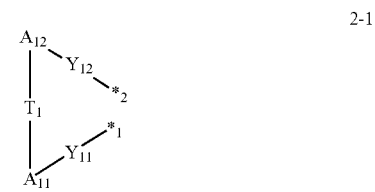

2-1

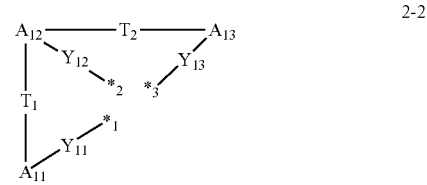

2-2

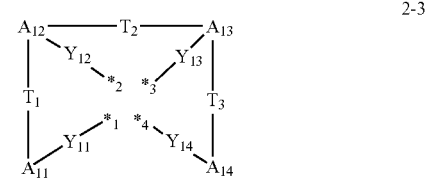

2-3

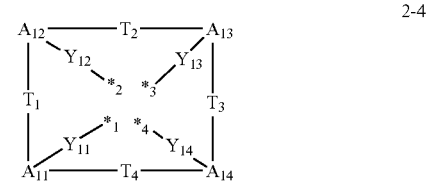

2-4 wherein, in Formulae 2-1 to 2-4, $A_{11}$ to $A_{14}$ may each independently be a $C_5$-$C_{30}$ carbocyclic group that is unsubstituted or substituted with at least one $R_{10}$, a $C_1$-$C_{30}$ heterocyclic group that is unsubstituted or substituted with at least one $R_{10}$, or a non-cyclic group, $Y_{11}$ to $Y_{14}$ may each independently be a chemical bond (for example, a covalent bond, a coordinate bond, etc.), O, S, $N(R_{91})$, $B(R_{91})$, $P(R_{91})$, or $C(R_{91})(R_{92})$, $T_1$ to $T_4$ may each independently be a single bond, a double bond, *—$N(R_{93})$—*, *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(=O)—*', *—S(=O)—*', *—S(=O)$_2$—*', *—$C(R_{93})$=*', *=$C(R_{93})$—*', *—$C(R_{93})$=$C(R_{94})$—*', *—C(=S)—*', or *—C≡C—*', $R_{10}$ and $R_{91}$ to $R_{94}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)(Q), or —P($Q_8$)(Q),

*1, *2, *3, and *4 each indicate a binding site to transition metal of the organometallic compound.

Substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group include:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ neterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ neterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), P($Q_{28}$)($Q_{29}$), or any combination thereof;

—N($Q_{31}$)($Q_{32}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group which is unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group which is unsubstituted or substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

In an embodiment, $A_{11}$ to $A_{14}$ in Formulae 2-1 to 2-4 may each independently be:

a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each substituted or unsubstituted with at least one $R_{10}$; or a carbonyl group.

In an embodiment, $Y_{11}$ to $Y_{14}$ in Formulae 2-1 to 2-4 may each independently be a chemical bond (for example, a covalent bond, a coordinate bond, etc.), O, or S.

In one or more embodiments, $T_1$ to $T_4$ in Formulae 2-1 to 2-4 may each independently be a single bond, *—N($R_{93}$)—*', *—B($R_{93}$)—*', *—P($R_{93}$)—*', *—C($R_{93}$)($R_{94}$)—*', *—Si($R_{93}$)($R_{94}$)—*', *—Ge($R_{93}$)($R_{94}$)—*', *—S—*', *—Se—*', or *—O—*'.

In one or more embodiments, $R_{10}$ and $R_{91}$ to $R_{94}$ in Formula 2-1 to 2-4 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein $Q_1$ to $Q_9$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

The organometallic compound may include, in addition to the ligands represented by Formulae 2-1 to 2-4, a ligand, for example, —F, —Cl, —I, —Br, or acetylacetonate.

In an embodiment, the organometallic compound may be represented by Formula 2(1):

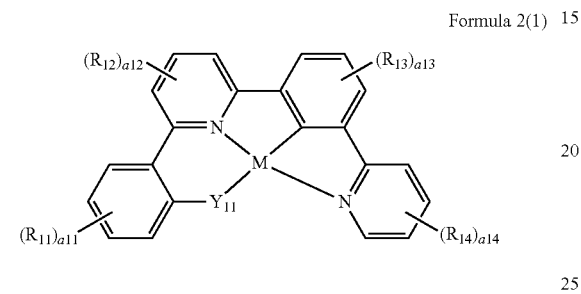

Formula 2(1)

wherein, in Formula 2(1),

M is a transition metal as described herein, $Y_{11}$ is the same as described in the present specification, $R_{11}$ to $R_{14}$ are each the same as described in connection with $R_{10}$, a11 and a14 may each independently be an integer from 0 to 4, and a12 and a13 may each independently be an integer from 0 to 3.

For example, $Y_{11}$ in Formula 2(1) may be O or S.

In an embodiment, $A_2$ of Formula 1 may be a monovalent group derived from one of Compounds PD1 to PD87:

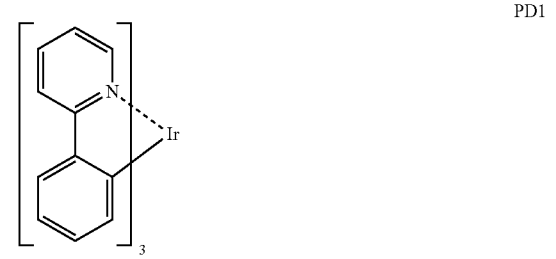

PD1

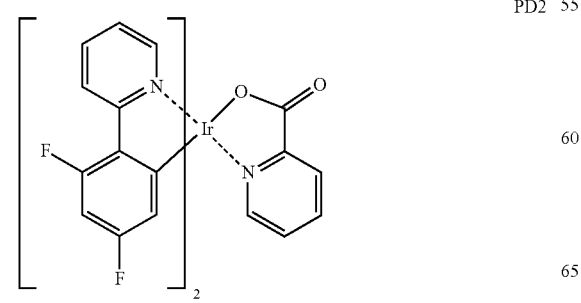

PD2

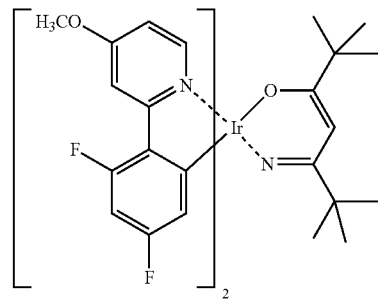

PD3

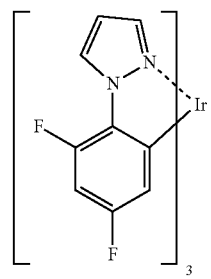

PD4

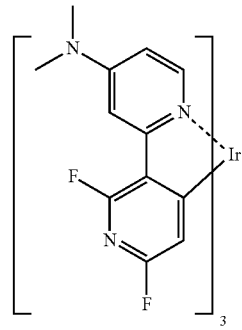

PD5

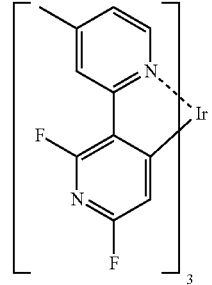

PD6

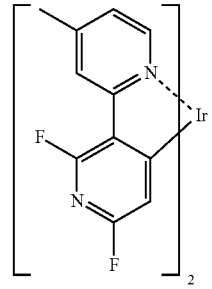

PD7

-continued
PD8
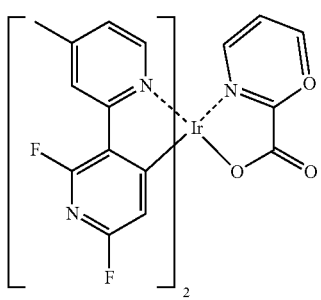
PD9
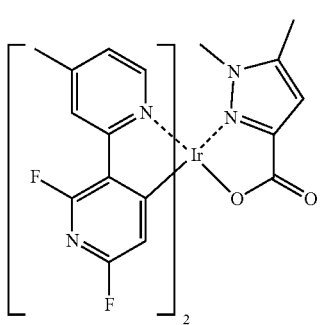
PD10
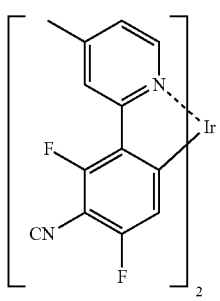
PD11
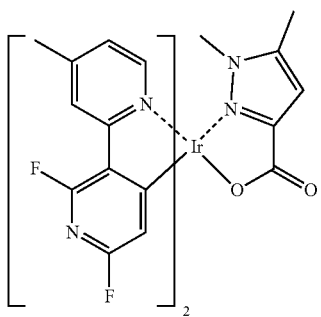
PD12
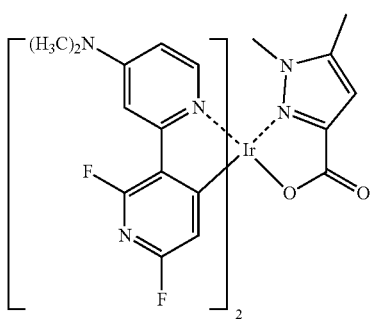
-continued
PD13
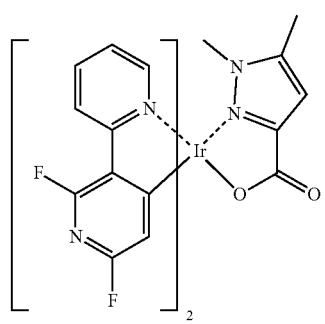
PD14
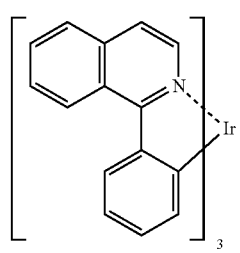
PD15
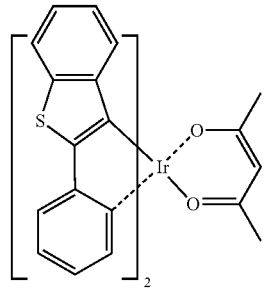
PD16
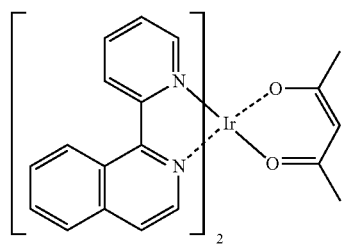
PD17
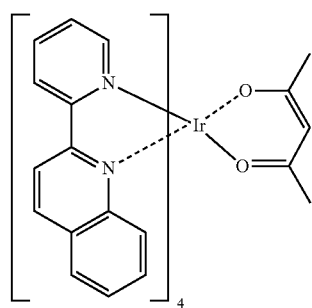

PD18 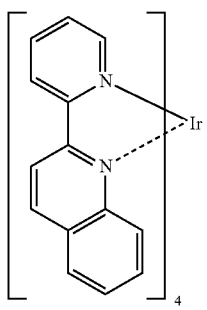
PD19 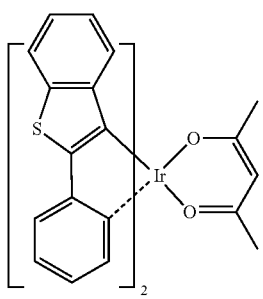
PD20 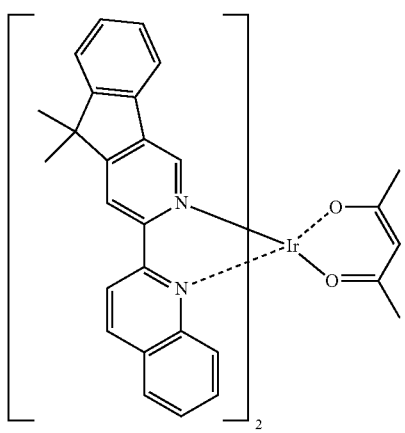
PD21 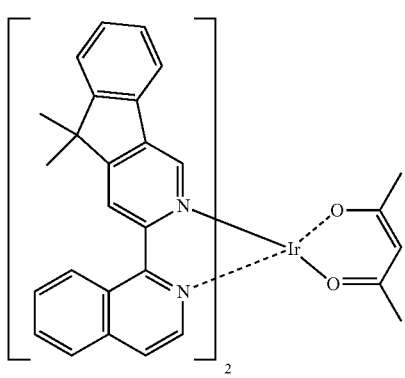
PD22 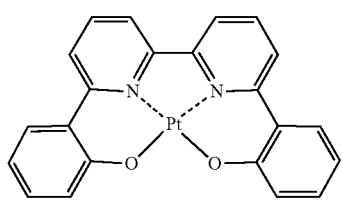
PD23 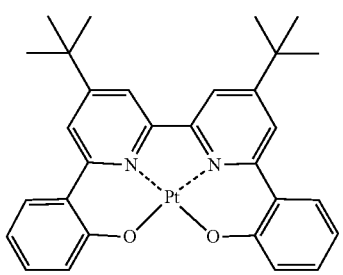
PD24 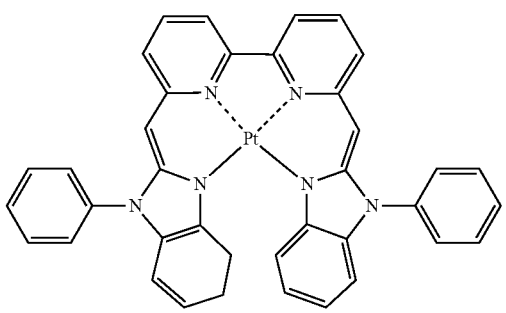
PD25 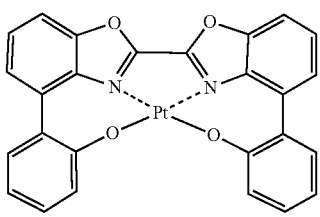
P26 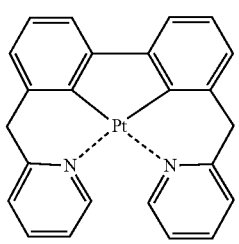
P27 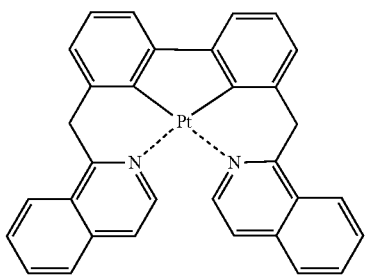
P28 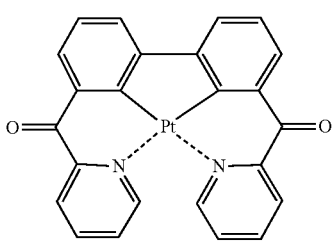

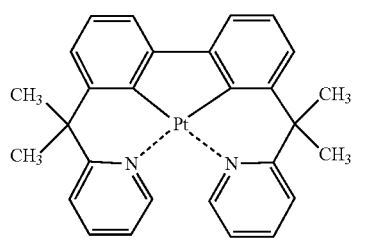
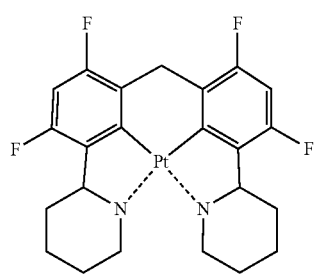
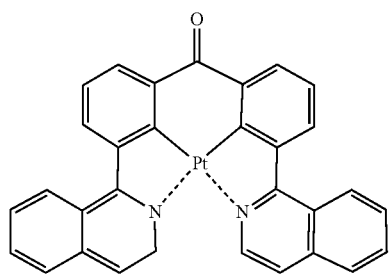
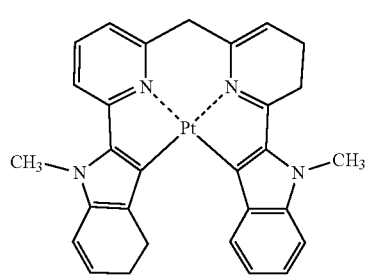
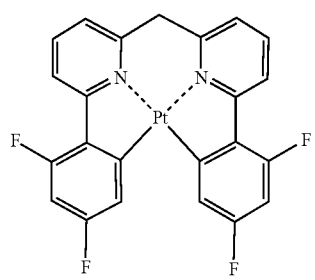
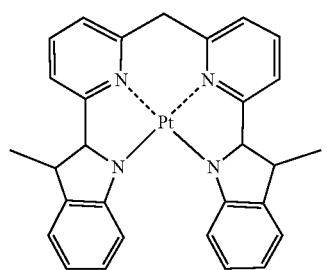
P29
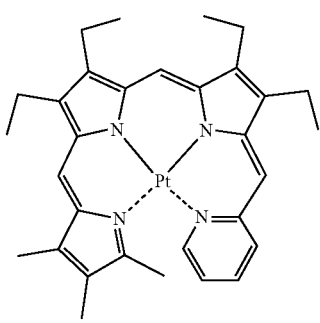
P30
P31
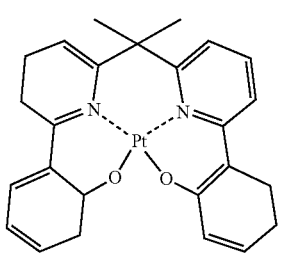
P32
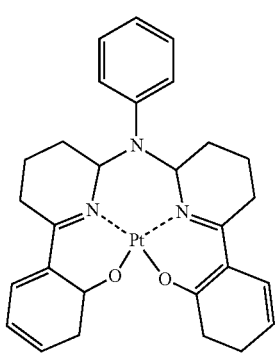
P33
P34
P35
P36
P37
P38
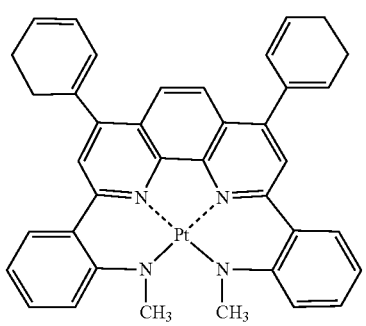
P39
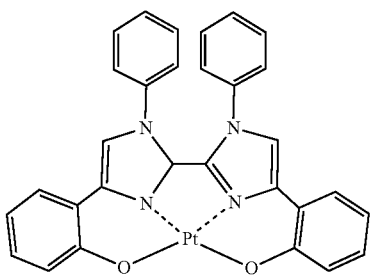

-continued
P40 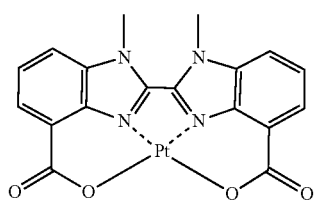
P41 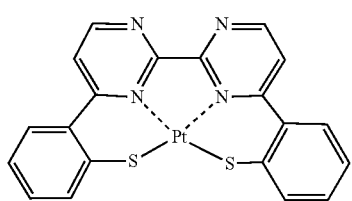
P42 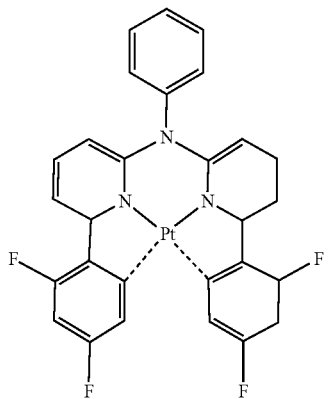
P43 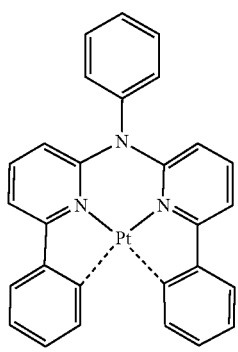
P44 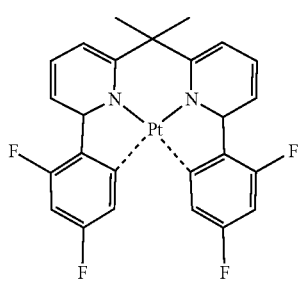
-continued
P45 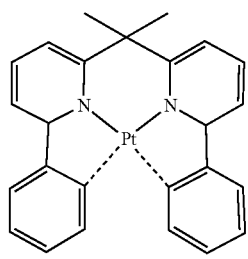
P46 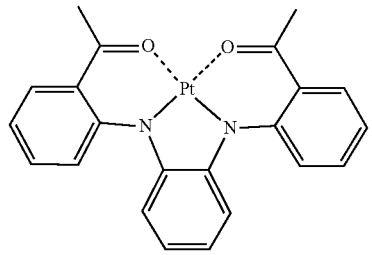
P47 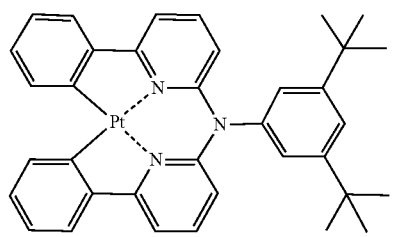
P48 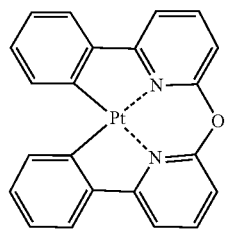
P49 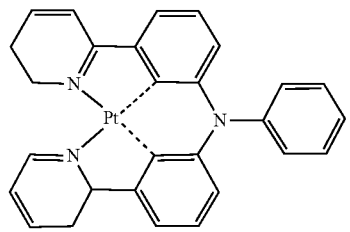
P50 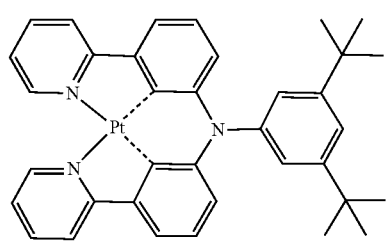

P51 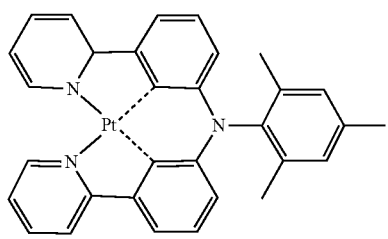
P52 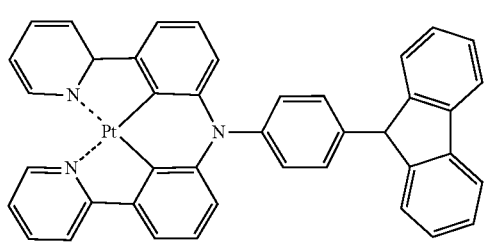
P53 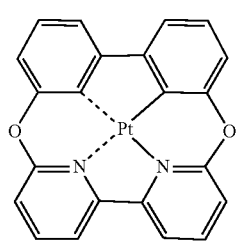
P54 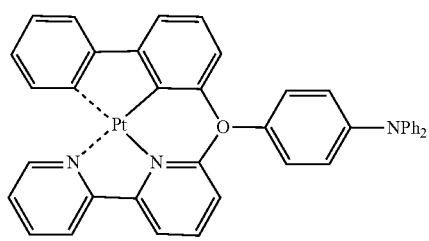
P55 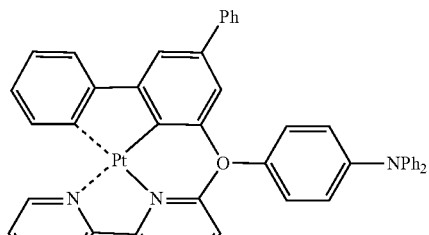
P56 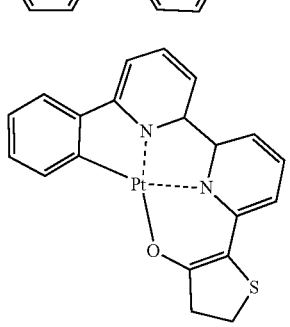
P57 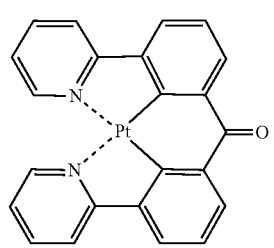
P58 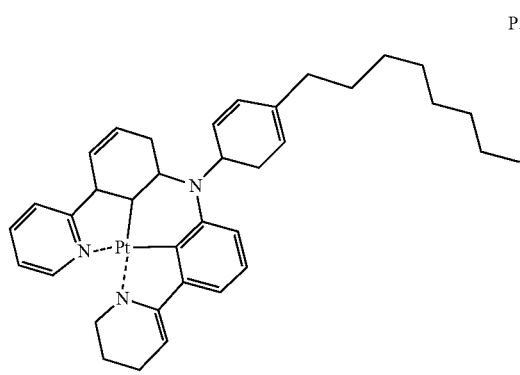
P59 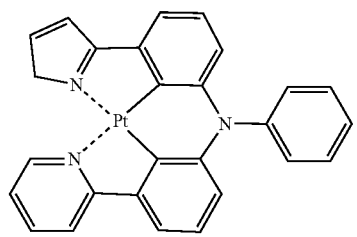
P60 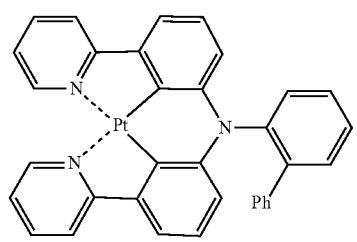
P61 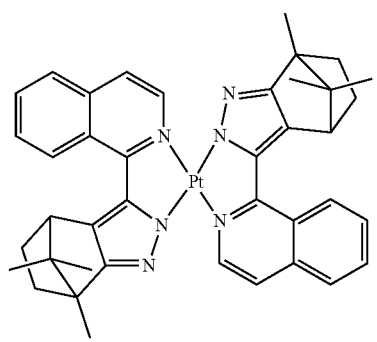

-continued
P62 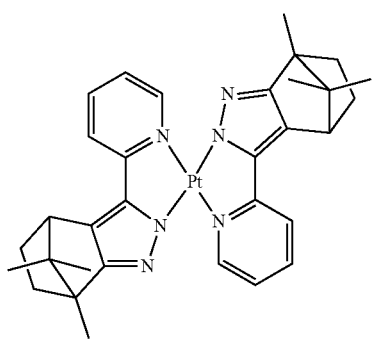
P63 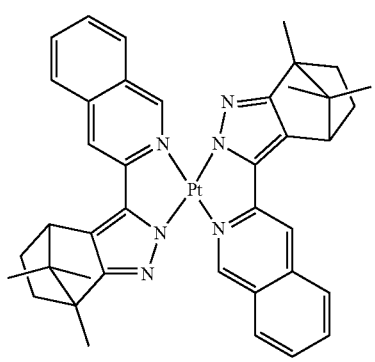
P64 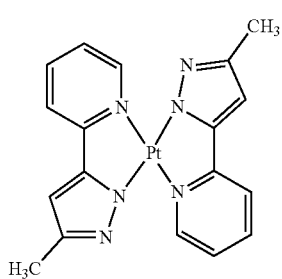
P65 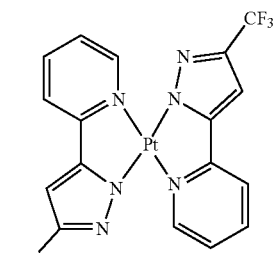
P66 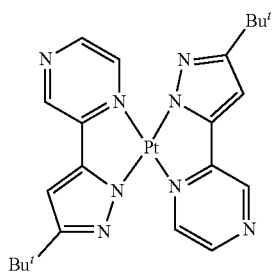
-continued
P67 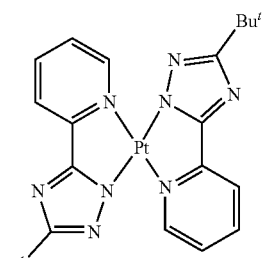
P68 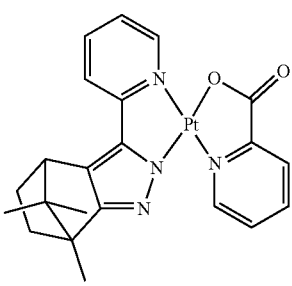
PD69 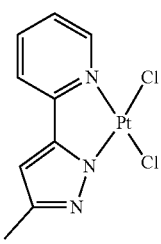
PD70 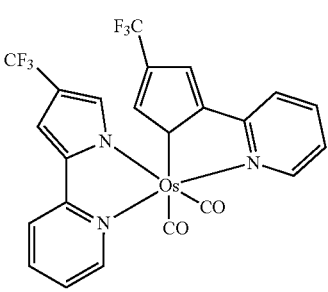
PD71 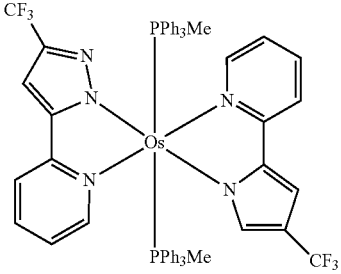

-continued
PD72
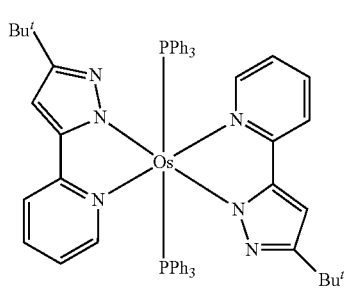
PD73
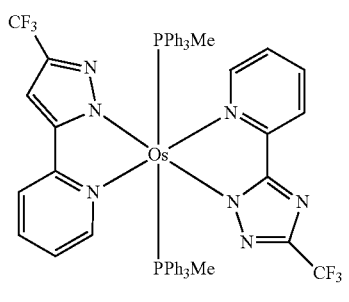
PD74
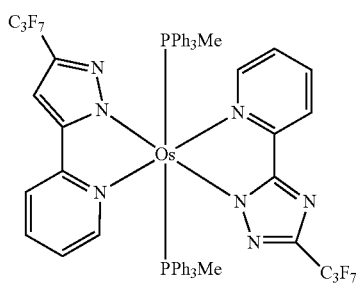
PD75
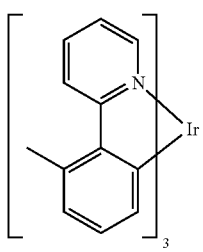
PD76
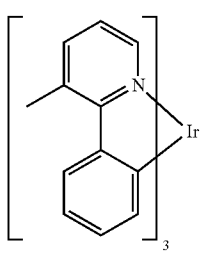
PD77
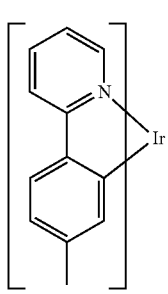
-continued
PD78
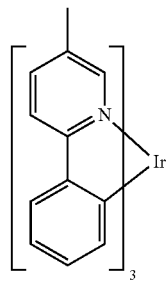
PD79(FIIr6)
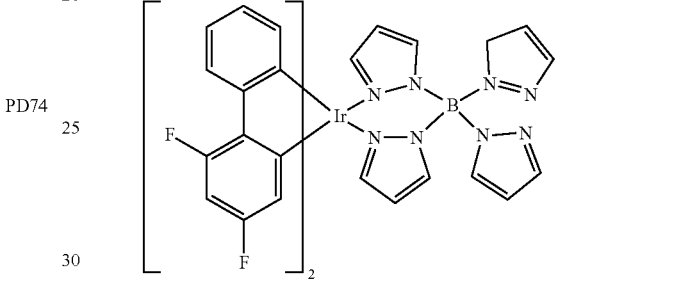
P80
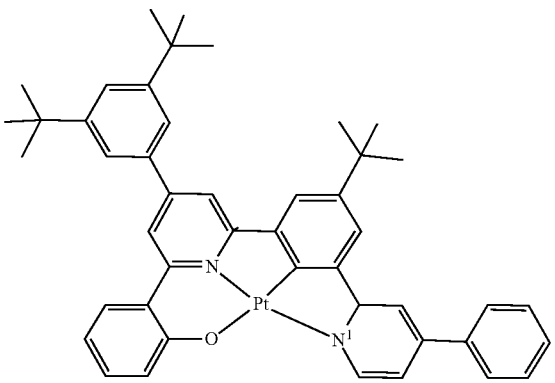
PD81
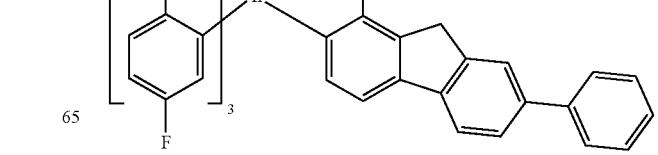

P82 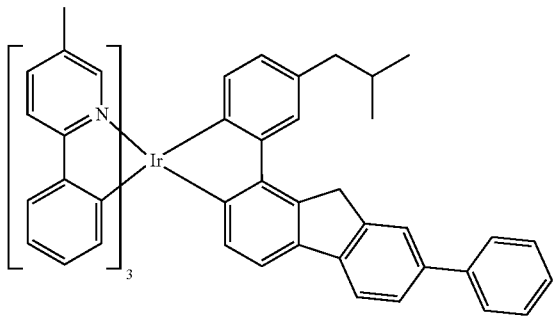

P83 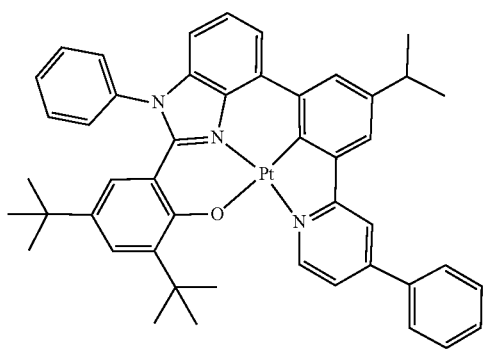

P84 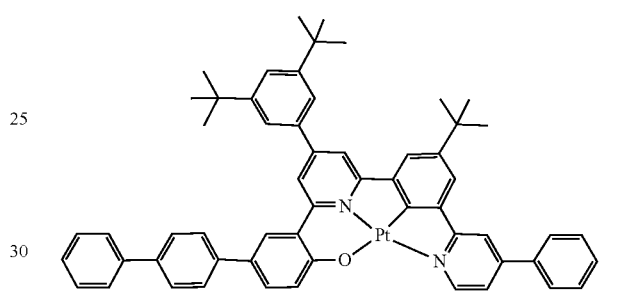

P85 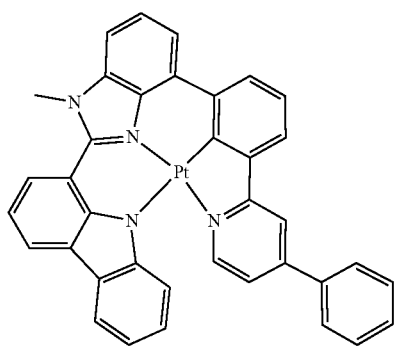

P86 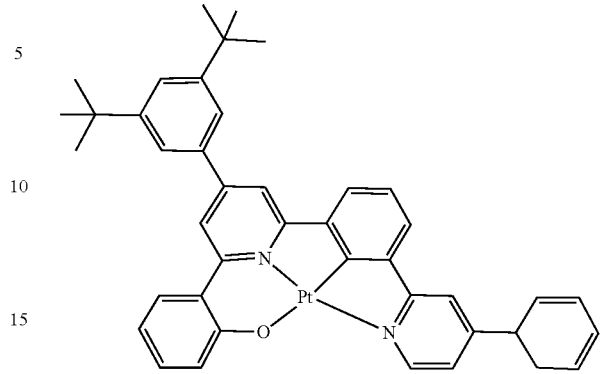

P87

In addition, $A_2$ of Formula 1 may be a monovalent group derived from a fluorescent luminescent compound, which is a compound capable of emitting fluorescent light.

The fluorescence may be a prompt fluorescence, delayed fluorescence, etc. The delayed fluorescence may be thermally activated delayed fluorescence.

In an embodiment, the fluorescent luminescent compounds may be a thermally activated delayed fluorescence emitter. The thermally activated delayed fluorescence emitter may be selected from any compound that is capable of emitting delayed fluorescence according to the thermally activated delayed fluorescence emission mechanism.

The difference (absolute value) between the triplet energy level (eV) of the thermally activated delayed fluorescence emitter and the singlet energy level (eV) of the thermally activated delayed fluorescence emitter may be equal to or greater than 0 eV and less than or equal to 0.5 eV. When the difference between the triplet energy level (eV) of the thermally activated delayed fluorescence emitter and the singlet energy level (eV) of the thermally activated delayed fluorescence emitter satisfies the above range, the up-conversion from the triplet state to the singlet state may be effectively achieved, so that the thermally activated delayed fluorescence emitter may emit high-efficiency delayed fluorescence.

For example, the fluorescent luminescent compounds may be amino group-containing condensed cyclic compounds, compounds containing donors and acceptors, boron-containing compounds, and the like.

For example, the fluorescent luminescent compounds may be compounds represented by Formula 501:

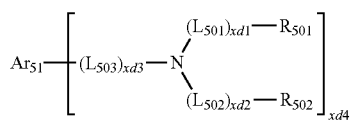

Formula 501 wherein, in Formula 501,

Ar$_{501}$ may be a naphthalene group, a heptalene group, a fluorene group, a spiro-bifluorene group, a carbazole group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, or an indenoanthracene group, each substituted or unsubstituted with at least one R$_{10a}$, L$_{501}$ to L$_{503}$ may each independently be a C$_5$-C$_{30}$ carbocyclic group that is unsubstituted or substituted with at least one R$_{10a}$ or a C$_2$-C$_{30}$ heterocyclic group that is unsubstituted or substituted with at least one R$_{10a}$, R$_{501}$ and R$_{502}$ may each independently be a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each unsubstituted or substituted with at least one R$_{10a}$, xd1 to xd3 may each independently be an integer from 0 to 3, and xd4 may be an integer from 0 to 4.

For example, xd4 of Formula 501 may be an integer from 2 to 4.

R$_{10a}$ is the same as described in connection with R$_{10}$.

A compound represented by Formula 501 may emit prompt fluorescence.

For example, A$_2$ of Formula 1 may be a monovalent group derived from one of Compounds FD1 to FD14 or one of FD(1) to FD(17):

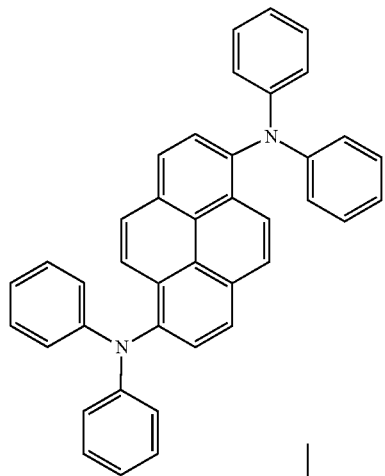

FD1

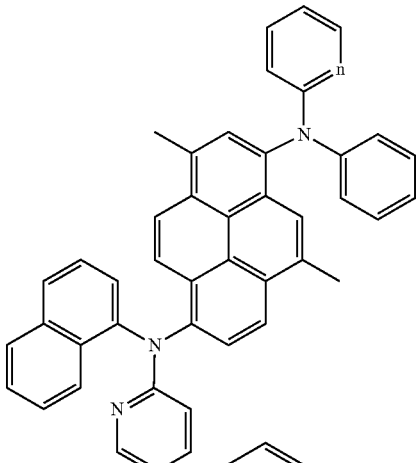

FD2

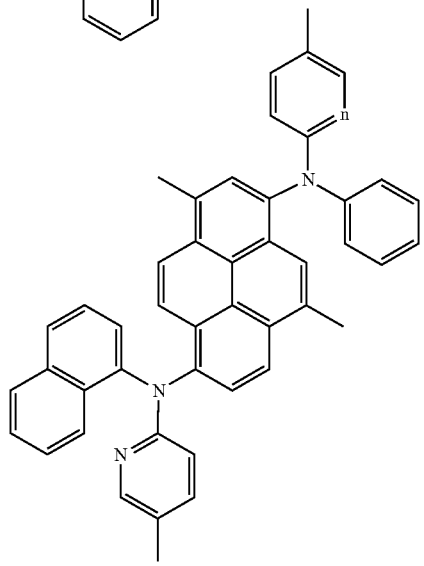

FD3

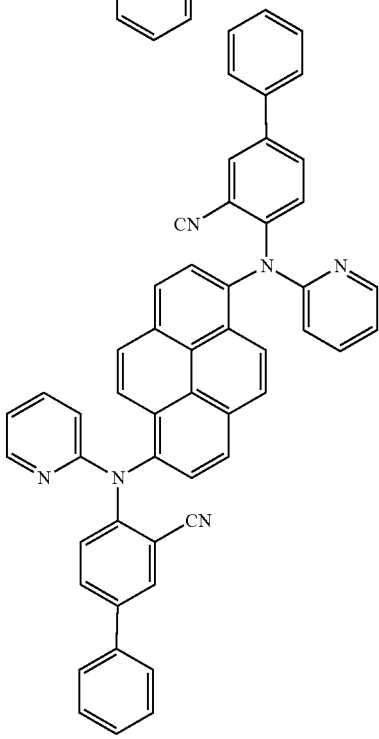

FD4

-continued
FD5
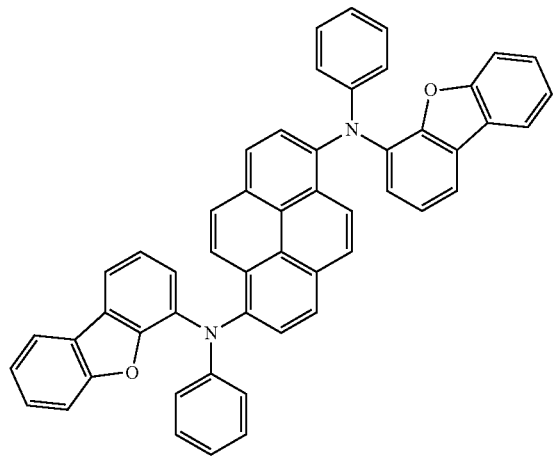
FD6
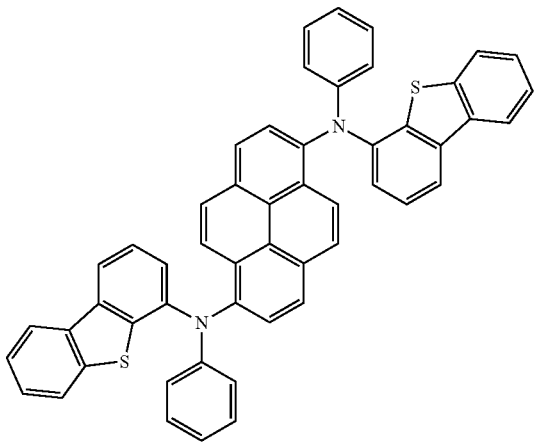
FD7
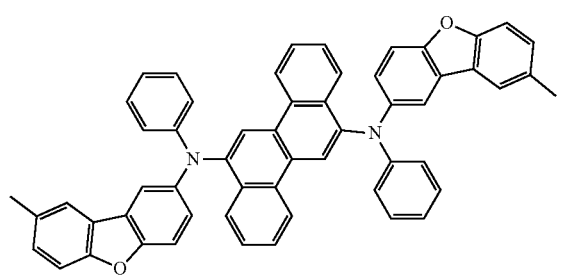
FD8
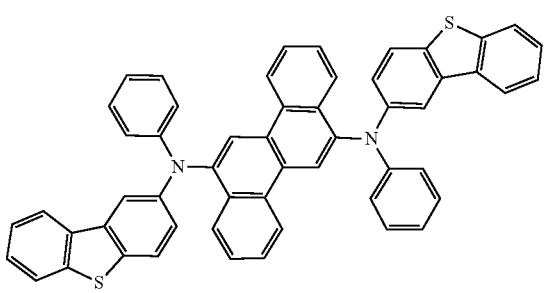
FD9
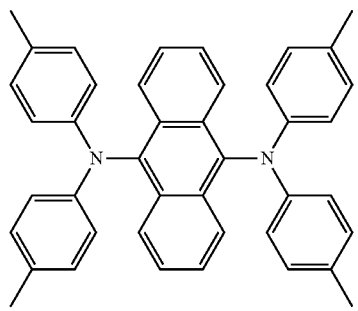
FD10
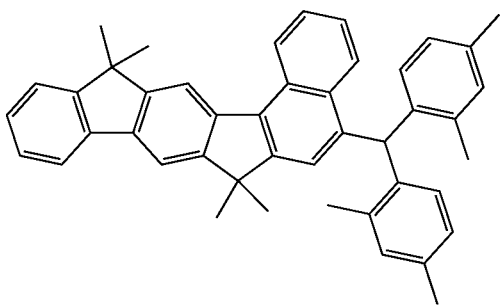
FD9
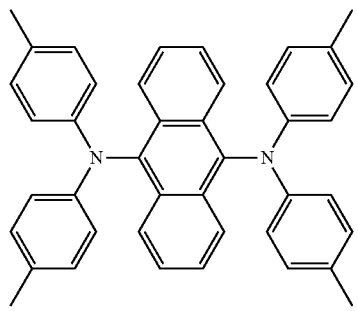

-continued
FD11 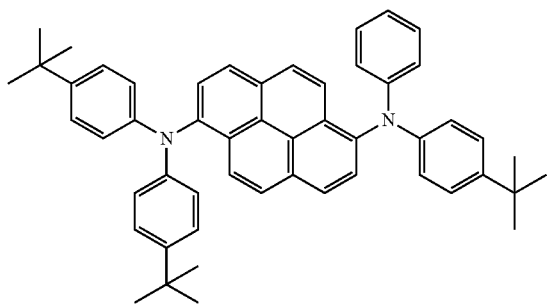 FD12 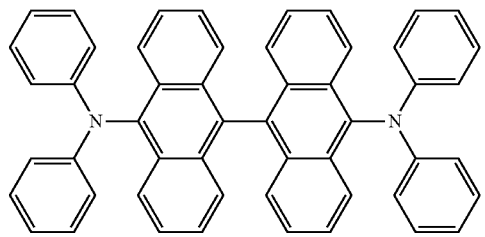
FD13 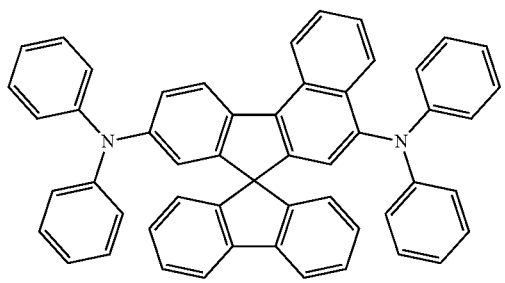 FD14 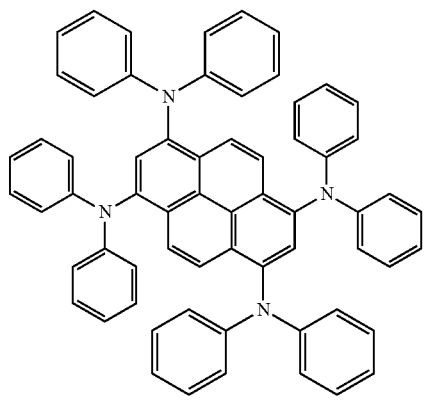
FD(1) 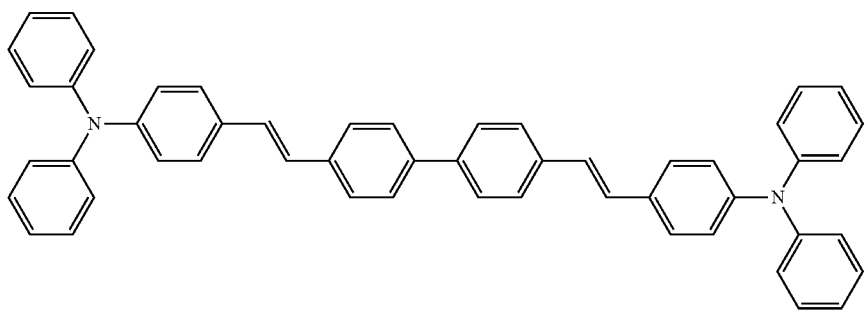
FD(2) 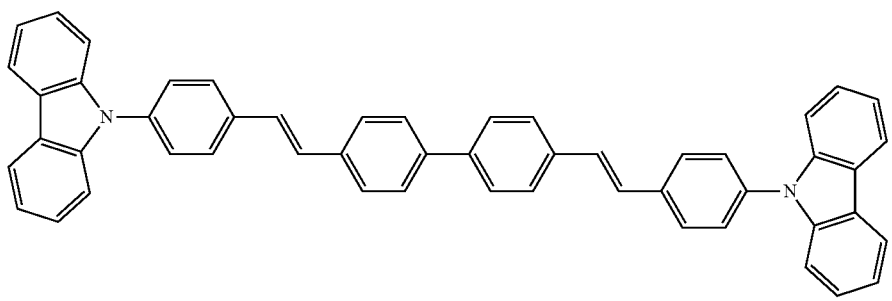

-continued
FD(3)
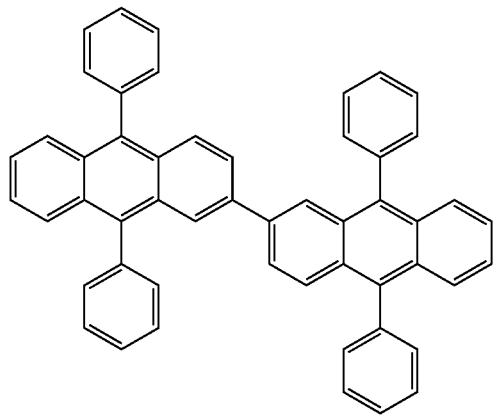
FD(4)
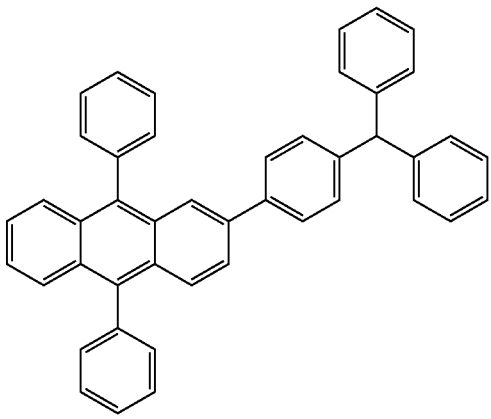
FD(5)
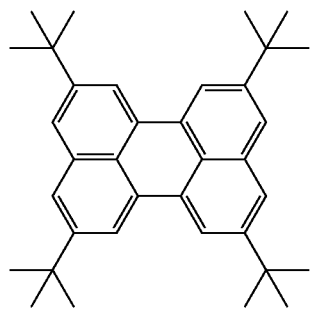
FD(6)
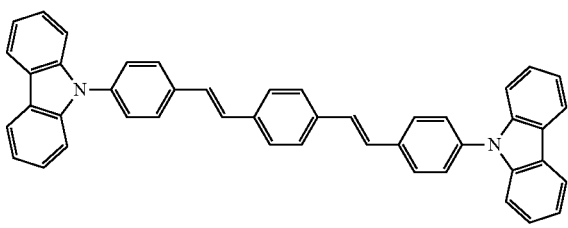
FD(7)
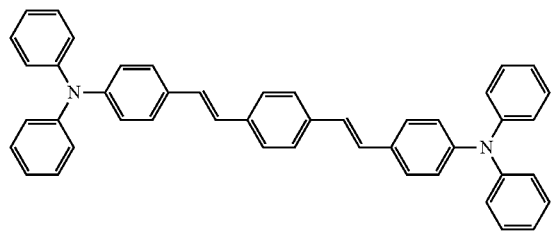
FD(8)
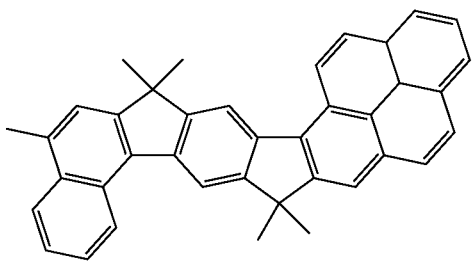
FD(9)
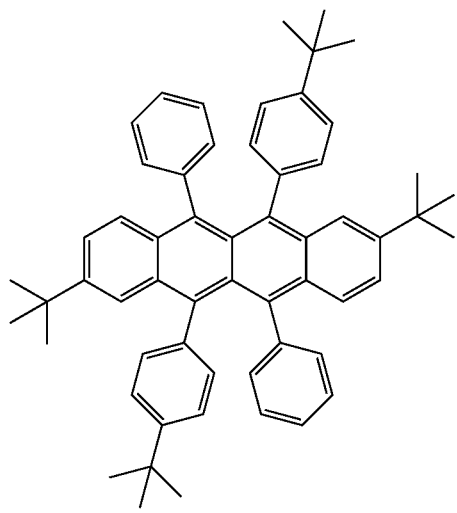
FD(10)
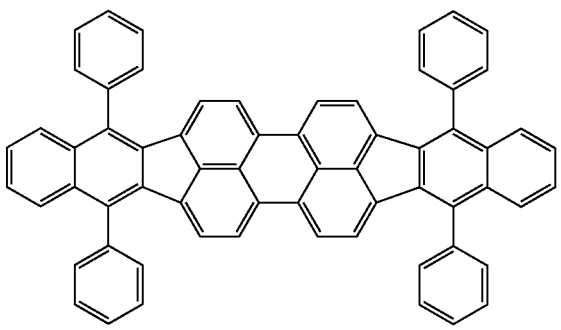

-continued

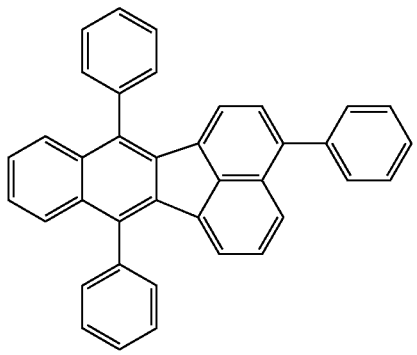
FD(11)

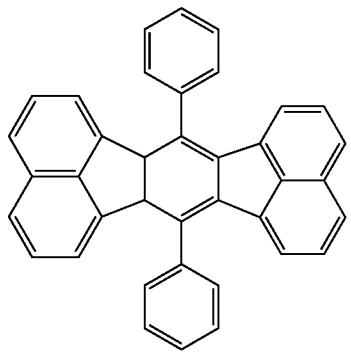
FD(12)

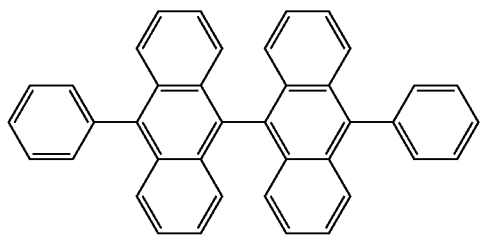
FD(13)

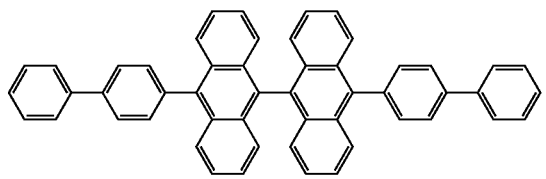
FD(14)

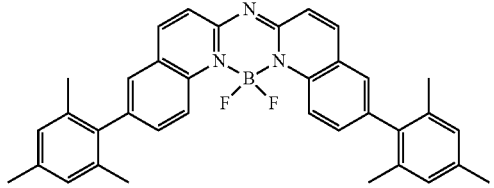
FD(15)

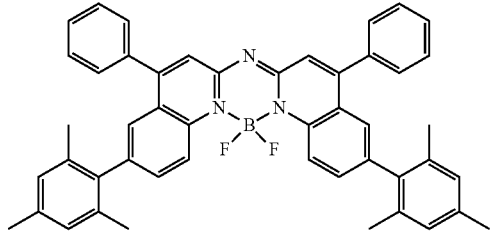
FD(16)

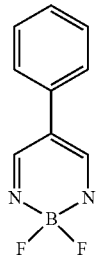
FD(17)

In an embodiment, the fluorescent luminescent compounds may include a compound represented by Formula 11:

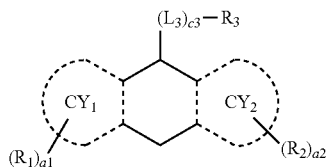

<Formula 11>

$X_1$ in Formula 11 may be a single bond, N-[$(L_4)_{c4}$-$R_4$], $C(R_5)(R_6)$, O, or S.

For example, $X_1$ may be a single bond.

Ring $CY_1$ and ring $CY_2$ in Formula 11 may each independently be a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group.

For example, ring $CY_1$ and ring $CY_2$ may each independently be a benzene group, a fluorene group, a carbazole group, a dibenzofuran group, a dibenzothiophene group, or a dibenzosilole group, and at least one of ring $CY_1$ and ring $CY_2$ may each independently be a benzene group.

$L_3$ and $L_4$ may each independently be a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

For example, $L_3$ and $L_4$ may each independently be a benzene group, a naphthalene group, a fluorene group, a pyridine group, a pyrimidine group, a pyrazine group, a pyridazine group, a triazine group, a quinoline group, an isoquinoline group, a carbazole group, a dibenzofuran group, a dibenzothiophene group, or an indolocarbazole group, each unsubstituted or substituted with at least one $R_{10a}$.

c3 and c4 indicate the number of $L_3$ and the number of $L_4$, respectively, and may each independently be an integer of 0 to 4. When c3 is 2 or more, two or more of $L_3$(s) may be identical to or different from each other, and when c4 is 2 or more, two or more of $L_4$(s) may be identical to each other or different from each other. For example, c3 and c4 may each independently be 0, 1, or 2, but embodiments of the present disclosure are not limited thereto. When c3 is 0, *-$(L_3)_{c3}$-*' may be a single bond, and when c4 is 0, *-$(L_4)_{c4}$-*' may be a single bond.

$R_1$ to $R_6$ in Formula 11 are the same as described in connection with $R_{10}$.

In an embodiment, $R_3$ in Formula 11 may include at least one π electron-deficient nitrogen-containing cyclic group.

The term "π electron-deficient nitrogen-containing cyclic group" as used herein refers to a group having a cyclic group having at least one *—N=*' moiety. In an embodiment, the π electron-deficient nitrogen-containing cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

In one or more embodiments, $R_3$ in Formula 11 may be a phenyl group, an indenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, an isoindolyl group, an indolyl group, a furanyl group, a thiophenyl group, a silolyl group, a benzofuranyl group, a benzothiophenyl group, a benzosilolyl group, a carbazolyl group, a dibenzofuranyl group, a dibenzothiophenyl group, a dibenzosilolyl group, an indeno carbazolyl group, an indolocarbazolyl group, a benzofuracarbazolyl group, a benzothienocarbazolyl group, a benzosilolocarbazolyl group, an imidazolyl group, a pyrazolyl group, a thiazolyl group, an isothiazolyl group, an oxazolyl group, an isoxazolyl group, a pyridinyl group, a pyrazinyl group, a pyridazinyl group, a pyrimidinyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a cinnolinyl group, a phenanthridinyl group, an acridinyl group, a phenanthrolinyl group, a phenazinyl group, a benzomidazolyl group, a benzoisothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, an azaindenyl group, an azaindolyl group, an azabenzofuranyl group, an azabenzothiophenyl group, an azabenzosilolyl group, an azafluorenyl group, an azacarbazolyl group, an azadibenzofuranyl group, an azadibenzothiophenyl group, or an azadibenzosilolyl group, each substituted or unsubstituted with deuterium, a $C_1$-$C_{10}$ alkyl group, a $C_1$-$C_{10}$ alkoxy group, a phenyl group, a ($C_1$-$C_{10}$ alkyl)phenyl group, a di($C_1$-$C_{10}$ alkyl)phenyl group, a biphenyl group, a terphenyl group, a di(phenyl)phenyl group, a di(biphenyl)phenyl group, a (pyridinyl)phenyl group, a di(pyridinyl)phenyl group, a (pyrimidinyl)phenyl group, a di(pyrimidinyl)phenyl group, a (triazinyl)phenyl group, a di(triazinyl)phenyl group, a pyridinyl group, a ($C_1$-$C_{10}$ alkyl)pyridinyl group, a di($C_1$-$C_{10}$ alkyl)pyridinyl group, a (phenyl)pyridinyl group, a di(phenyl)pyridinyl group, a (biphenyl)pyridinyl group, a di(biphenyl)pyridinyl group, a (terphenyl)pyridinyl group, a bi(terphenyl)pyridinyl group, a (pyridinyl)pyridinyl group, a di(pyridinyl)pyridinyl group, a (pyrimidinyl)pyridinyl group, a di(pyrimidinyl)pyridinyl group, a (triazinyl)pyridinyl group, a di(triazinyl)pyridinyl group, a pyrimidinyl group, a ($C_1$-$C_{10}$ alkyl)pyrimidinyl group, a di($C_1$-$C_{10}$ alkyl)pyrimidinyl group, a (phenyl)pyrimidinyl group, a di(phenyl)pyrimidinyl group, a (biphenyl)pyrimidinyl group, a di(biphenyl)pyrimidinyl group, a (terphenyl)pyrimidinyl group, a bi(terphenyl)pyrimidinyl group, a (pyridinyl)pyrimidinyl group, a di(pyridinyl)pyrimidinyl group, a (pyrimidinyl)pyrimidinyl group, a di(pyrimidinyl)pyrimidinyl group, a (triazinyl)pyrimidinyl group, a di(triazinyl)pyrimidinyl group, a triazinyl group, a ($C_1$-$C_{10}$ alkyl)triazinyl group, a di($C_1$-$C_{10}$ alkyl)triazinyl group, a (phenyl)triazinyl group, a di(phenyl)triazinyl group, a (biphenyl)triazinyl group, a di(biphenyl)triazinyl group, a (terphenyl)triazinyl group, a bi(terphenyl)triazinyl group, a (pyridinyl)triazinyl group, a di(pyridinyl)triazinyl group, a (pyrimidinyl)triazinyl group, a di(pyrimidinyl)triazinyl group, a (triazinyl)triazinyl group, a di(triazinyl)triazinyl group, a fluorenyl group, a di($C_1$-$C_{10}$ alkyl)fluorenyl group, a di(phenyl)fluorenyl group, a di(biphenyl)fluorenyl group, a carbazolyl group, a ($C_1$-$C_{10}$ alkyl)carbazolyl group, a (phenyl)carbazolyl group, a (biphenyl)carbazolyl group, a dibenzofuranyl group, a ($C_1$-$C_{10}$ alkyl)dibenzofuranyl group, a (phenyl)dibenzofuranyl group, a (biphenyl)dibenzofuranyl group, a dibenzothiophenyl group, a ($C_1$-$C_{10}$ alkyl)dibenzothiophenyl group, a (phenyl)dibenzothiophenyl group, a (biphenyl)dibenzothiophenyl group, or any combination thereof.

In an embodiment, the fluorescent luminescent compounds may include a compound represented by Formula 14A:

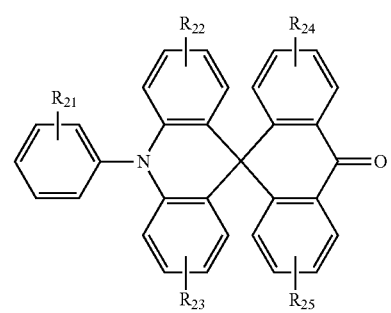

Formula 14A $R_{21}$ to $R_{25}$ in Formula 14A may each independently be hydrogen, deuterium, a cyano group, a $C_1$-$C_{10}$ alkyl group, a phenyl group, a biphenyl group, or a terphenyl group.

In an embodiment, $A_2$ in Formula 1 may be a monovalent group derived from one of Compounds D1-1 to D1-19:

D1-1
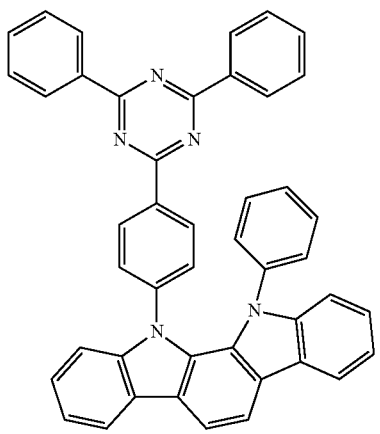
D1-2
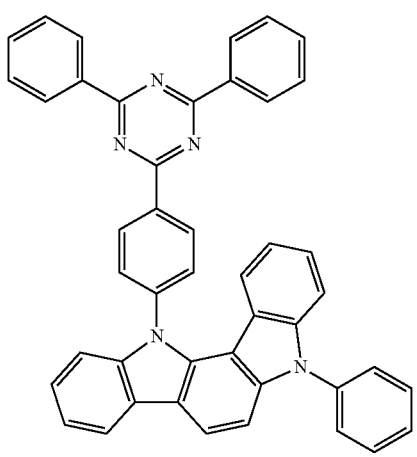
D1-3
D1-4
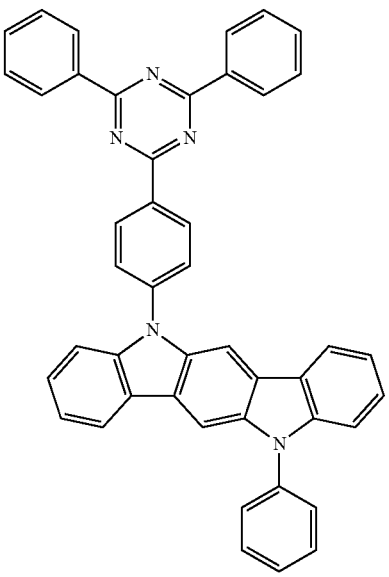
D1-5
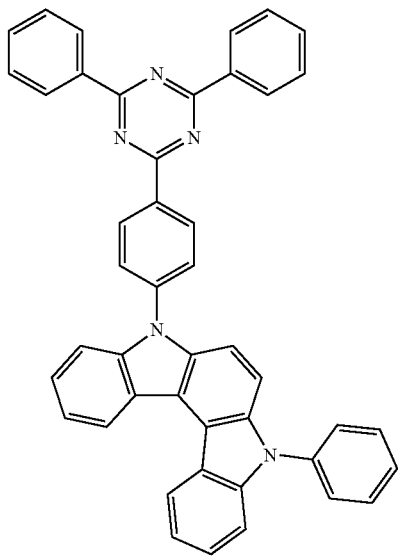

D1-6
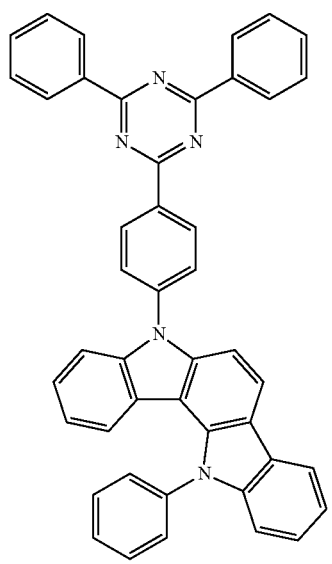
D1-7
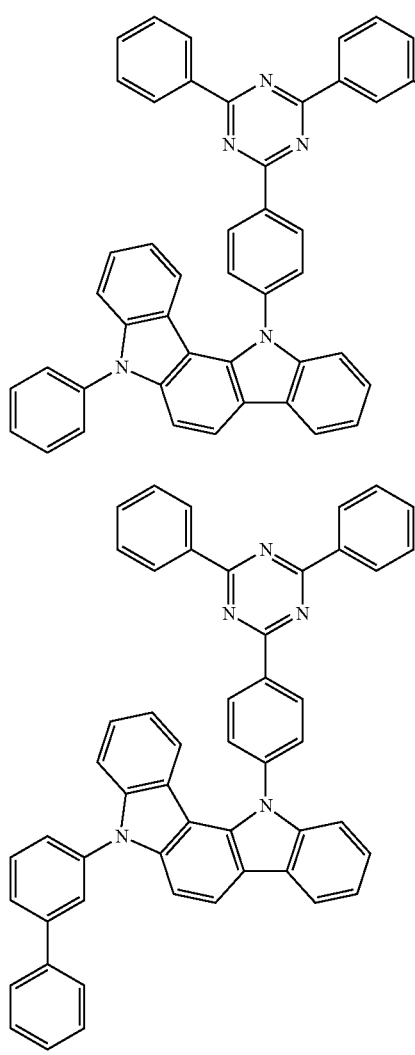
D1-8
D1-9
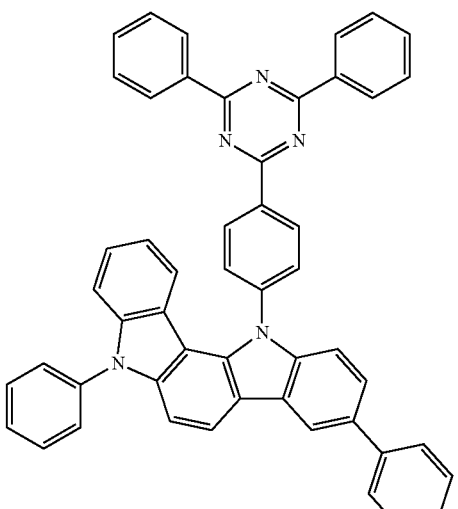
D1-10
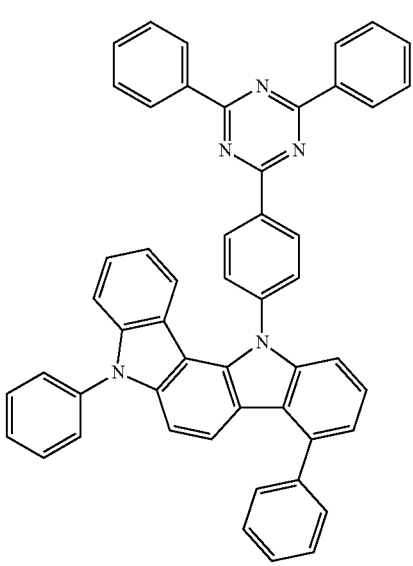
D1-11
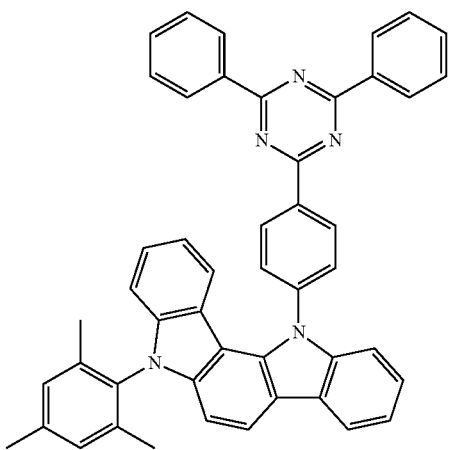

-continued
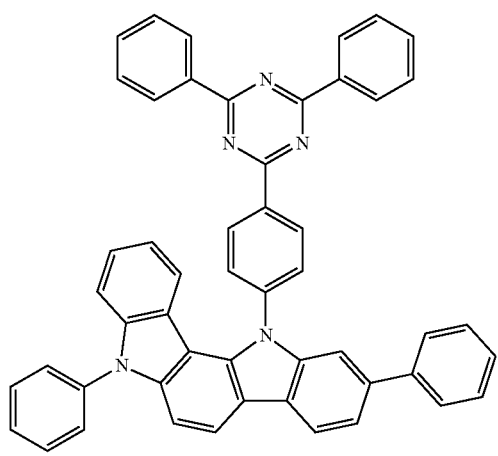
D1-12
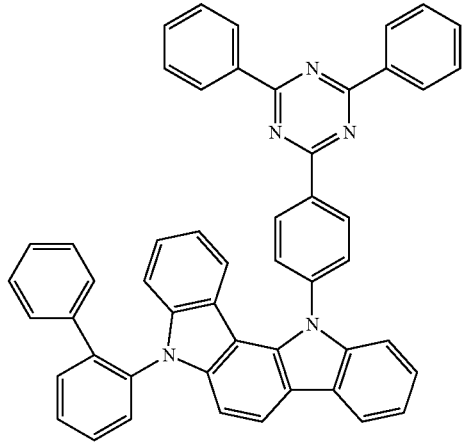
D1-15
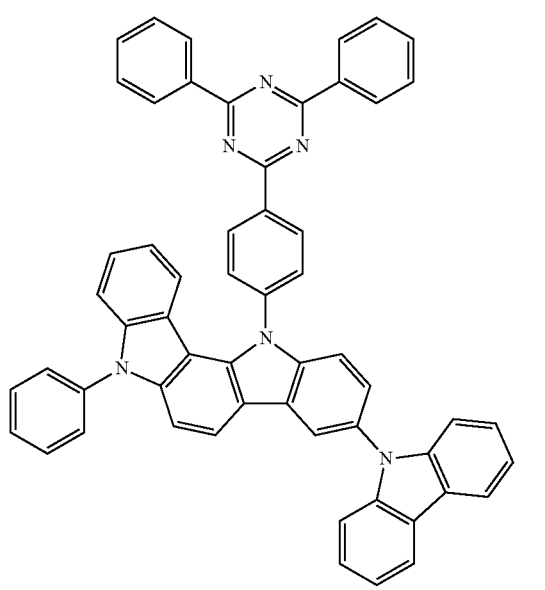
D1-13
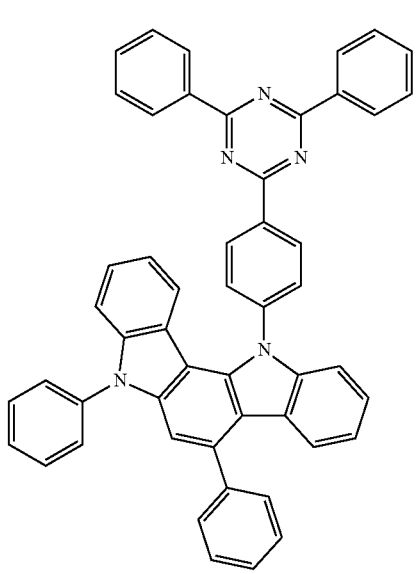
D1-16
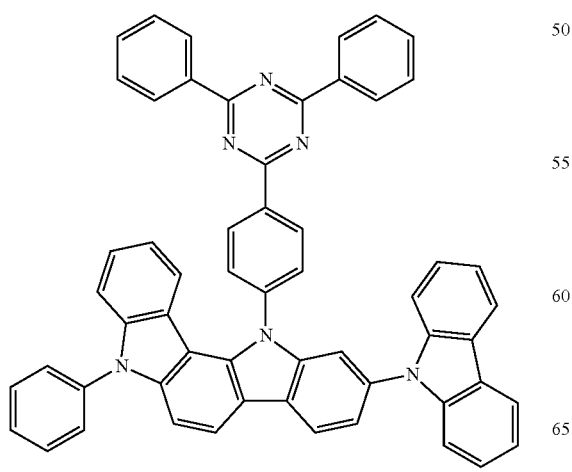
D1-14
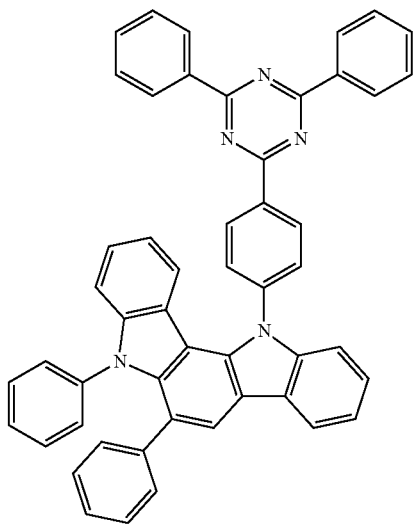
D1-17

D1-18

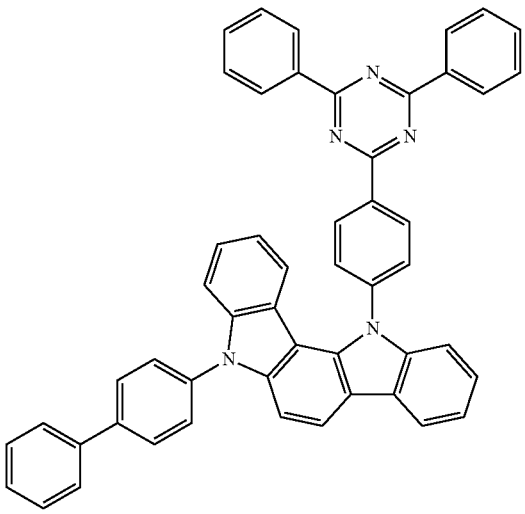

D1-19

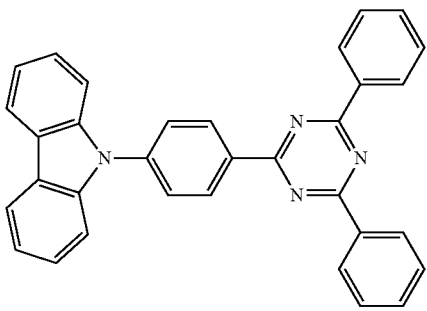

Meanwhile, $A_2$ of Formula 1 may be a monovalent group derived from a quantum dot.

The quantum dot refers to a crystal of a semiconductor compound, and may include all materials that emit different lengths of emission wavelengths depending on the size of the crystal. A diameter of the quantum dot may be, for example, in a range of about 1 nm to about 10 nm.

In an embodiment, the quantum dot may be a Group III-VI semiconductor compound; a Group II-VI semiconductor compound; a Group III-V semiconductor compound; a Group IV-VI semiconductor compound; a Group IV element or compound; or any combination thereof.

For example, the Groups III-VI semiconductor compound may include a binary compound, such as $In_2S_3$; a ternary compound, such as AgInS, $AgInS_2$, CuInS, or $CuInS_2$; or any combination thereof.

For example, the Groups II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

For example, the Groups III-V semiconductor compound may include a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InNAs, InNSb, InPAs, InPSb, or GaAlNP; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof.

For example, the Group IV-VI semiconductor compound may include a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

For example, the Group IV element or compound may include a single element, such as Si or Ge; a binary compound, such as SiC or SiGe; or any combination thereof.

In this regard, respective elements included in the binary compound, the ternary compound, or the quaternary compound may exist in particles at uniform concentration or may exist in the same particle in a state in which a concentration distribution is partially different.

Meanwhile, the quantum dot may have a single structure or a dual core-shell structure. In the case of the quantum dot having a single structure, the concentration of each element included in the corresponding quantum dot may be uniform. In one or more embodiments, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of an element existing in the shell is decreased as the element is located closer to the center of the core.

Examples of the shell of the quantum dot may be an oxide of a metal, or a non-metal, a semiconductor compound, or any combination thereof. For example, the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound, such as $MgAl_2O_4$, $CoFe_2O_4$, $NiFe_2O_4$, or $CoMn_2O_4$, but embodiments of the present disclosure are not limited thereto. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but embodiments of the present disclosure are not limited thereto.

The quantum dot may be a spherical particle, a pyramidal particle, a multi-arm particle, a cubic nanoparticle, a nanotube particle, a nanowire particle, a nanofiber particle, or a nanoplate particle, but embodiments of the present disclosure are not limited thereto.

m1 and m2 in Formula 1 indicate the number of $A_1$(s) and the number of $A_2$(s), respectively, and may each independently be an integer from 1 to 10. When m1 is 2 or more, two or more of $A_1$(s) may be identical to or different from each other, and when m2 is 2 or more, two or more of $A_2$(s) may be identical to or different from each other. For example, m1 may be an integer from 1 to 5, and m2 may be 1 or 2.

Figure 2:
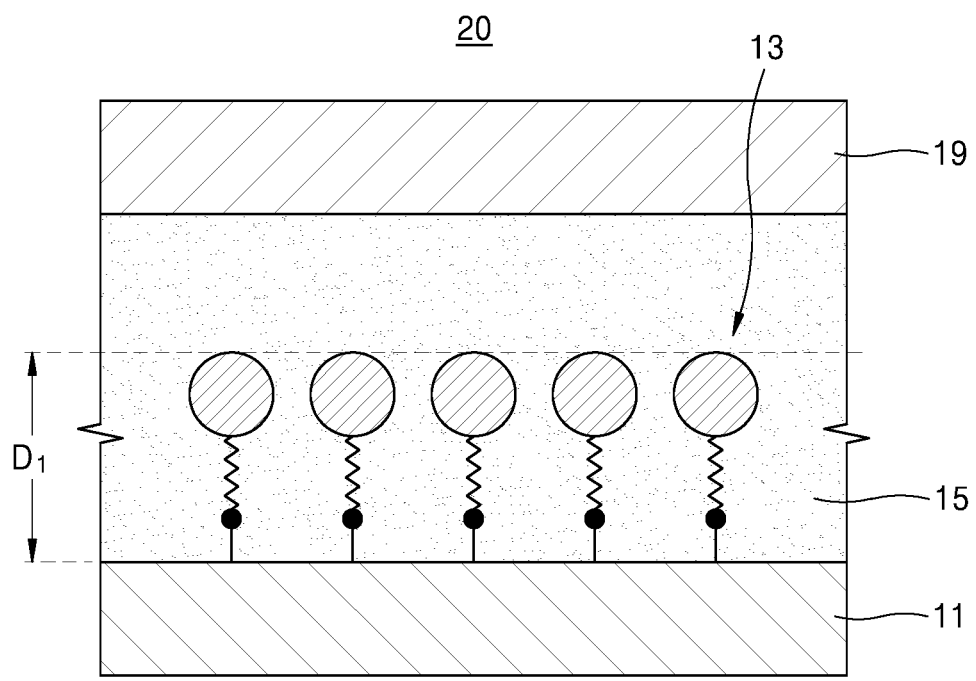
FIG. 2 shows a schematic cross-sectional view of a light-emitting device according to an exemplary embodiment.
Figure 3:
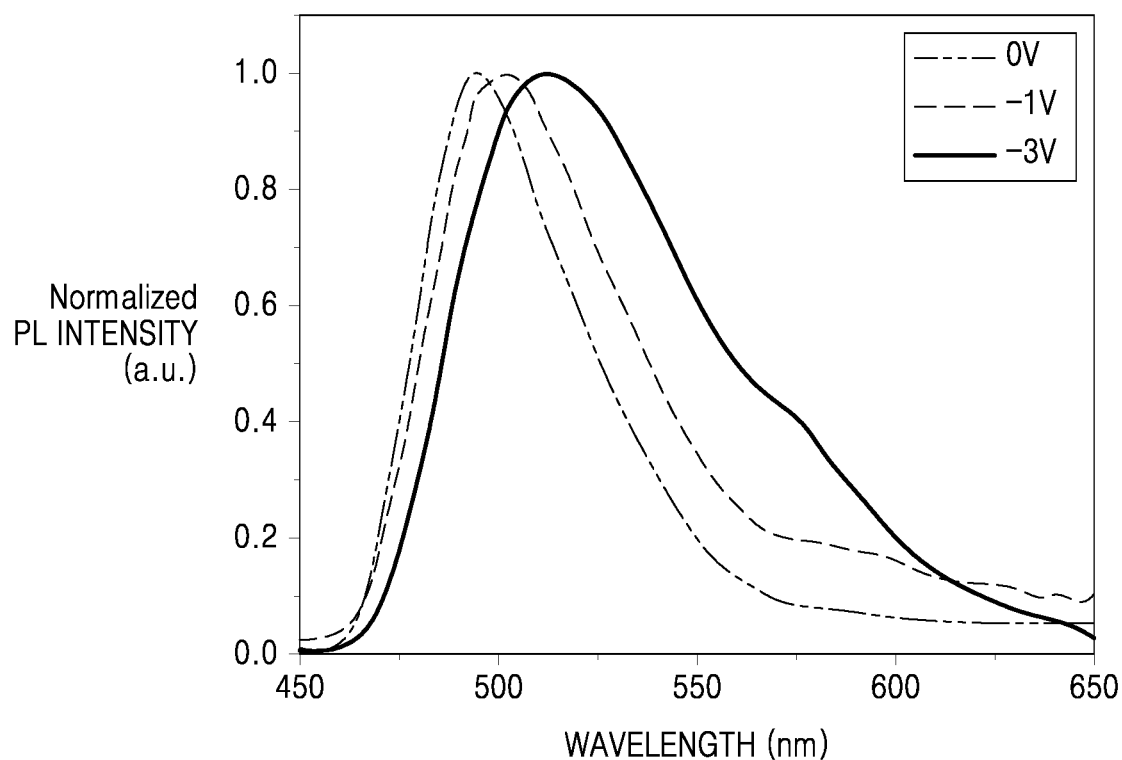
FIG. 3 is a graph showing a photoluminescence (PL) spectrum according to a voltage applied to the light-emitting device 1 manufactured in Example 1.

Description of FIG. 2

FIG. 2 shows a schematic cross-sectional view of a light-emitting device 20 according to an exemplary embodiment.

A first conductive layer 11, a light-emitting group 13, and the thickness ($D_1$) of a monolayer including a plurality of light-emitting groups 13 of the light-emitting device 20 may be understood by referring to the first conductive layer 11, the light-emitting group 13, and the thickness ($D_1$) of the monolayer including the plurality of light-emitting group 13 of the light-emitting device 10 in FIG. 1, respectively.

The light-emitting device 20 may further include a second conductive layer 19 facing the first conductive layer 11, and the light-emitting group 13 of the light-emitting device 20, that is, $A_2$ of Formula 1 may be located toward the second conductive layer 19.

The first conductive layer 11 may be an anode, and the second conductive layer 19 may be a cathode. In an embodiment, a material for forming the second conductive layer 19 may be metal, an alloy, an electrically conductive compound, or a combination thereof, each of which has a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second conductive layer 19.

Besides the light-emitting group 13, an interlayer 15 may be additionally located between the first conductive layer 11 and the second conductive layer 19. At least a portion of the light-emitting group 13 may be located to be included within the interlayer 15.

The interlayer 15 may include: a hole transport material, a light-emitting material, an electron transport material, or a combination thereof; or an insulating material, an electrolyte, air, or inert gas, and thus may maintain the structure of the light-emitting device 20, and may assist charge transfer inside the light-emitting group 13.

The hole transport material, the light-emitting material, and the electron transport material, which may be included in the interlayer 15, may respectively be any hole transport material, any light-emitting material, and any electron transport material, which may be located between a pair of electrodes of an organic light-emitting device of the related art.

In addition, when the interlayer 15 includes a hole transport material, a light-emitting material, an electron transport material, or a combination thereof, a hole transport region including a hole injection layer, a hole transport layer, an electron-blocking layer, a buffer layer, or a combination thereof and/or an electron transport region including a hole-blocking layer, an electron transport layer, an electron injection layer or a combination thereof may be included.

The hole transport material may be m-MTDATA, TDATA, 2-TNATA, NPB, p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

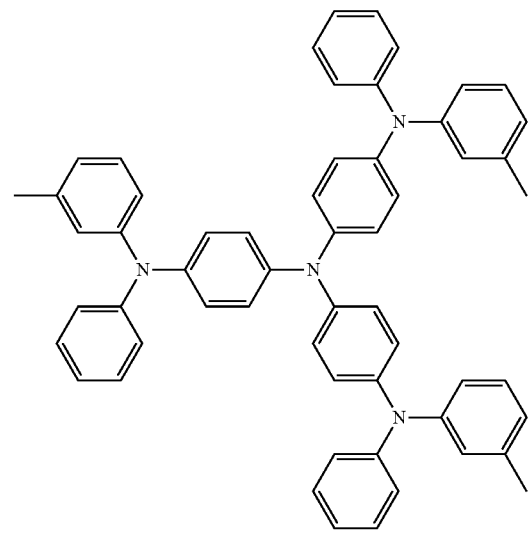

m-MTDATA

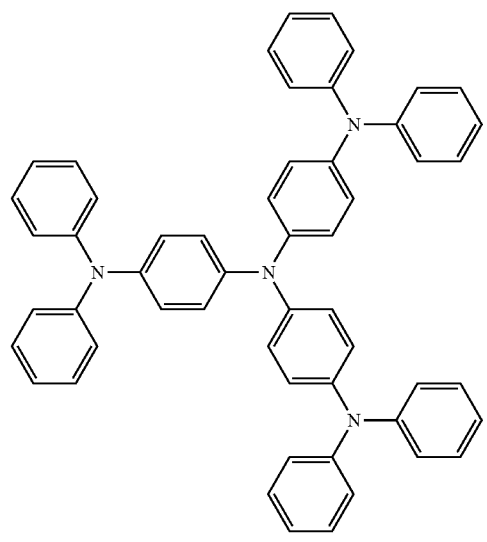

TDATA

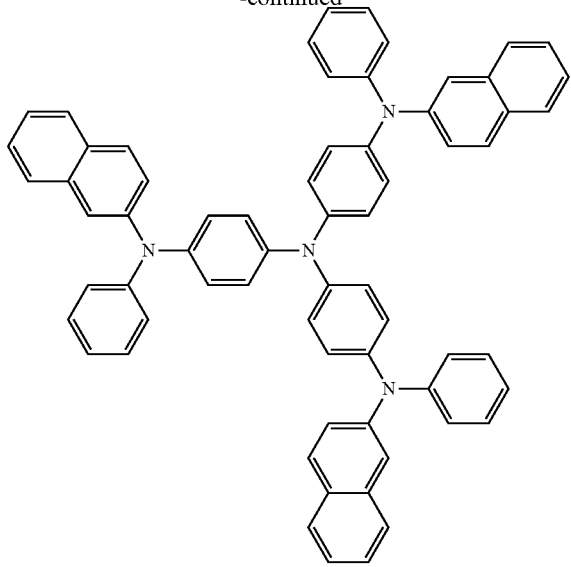
2-TNATA
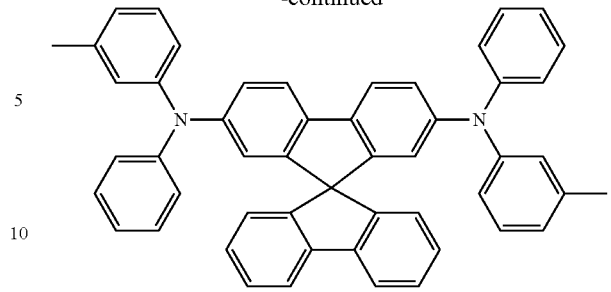
Spiro-TPD
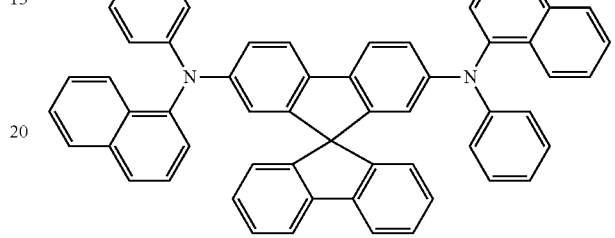
Spiro-NPB
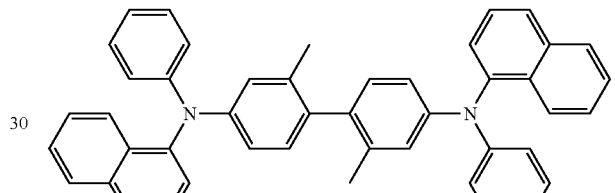
methylated NPB
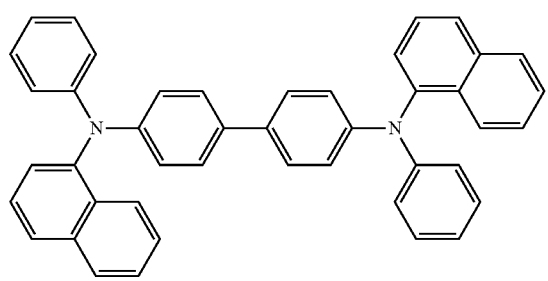
NPB
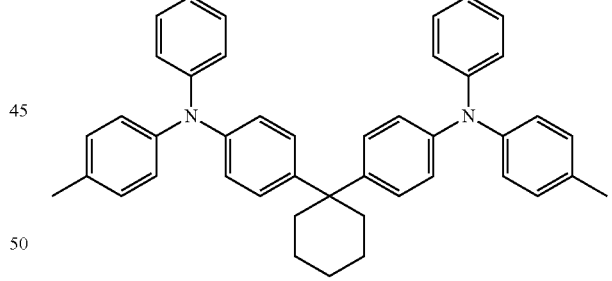
TAPC
β-NPB
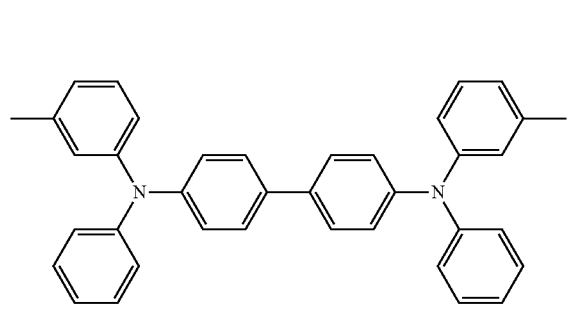
TPD
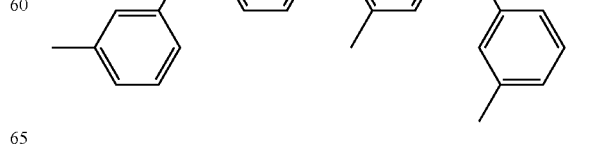
HMTPD Formula 201

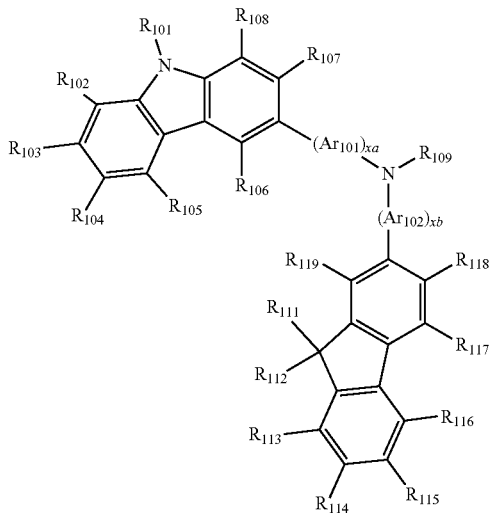

Formula 202

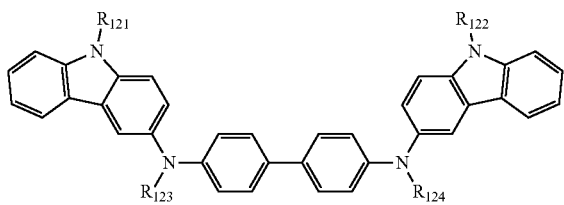

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0.

R$_{101}$ to R$_{108}$, R$_{111}$ to R$_{119}$ and R$_{121}$ to R$_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

R$_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

As the light-emitting material, any host that can be used in the emission layer of an organic light-emitting device may be used.

Examples of the host may include TPBi, TBADN, ADN (also referred to as "DNA"), CBP, CDBP, TCP, mCP, Compound H50, Compound H51, or any combination thereof:

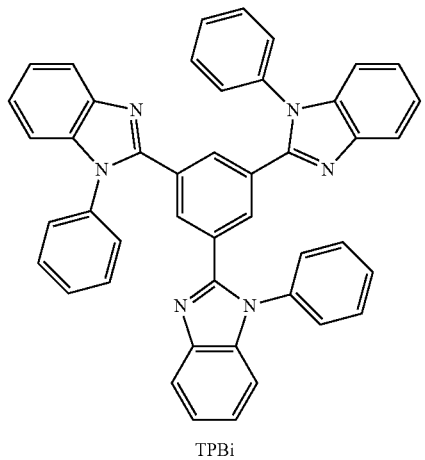

TPBi

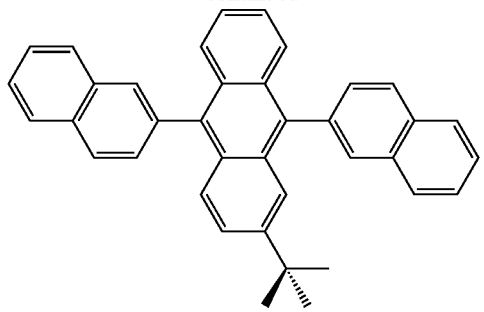
TBADN
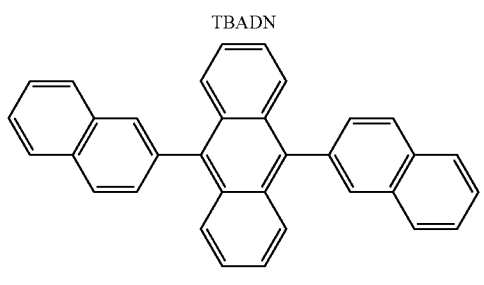
ADN
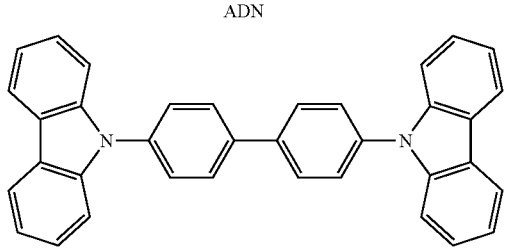
CBP
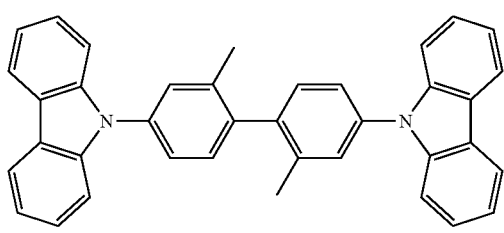
CDBP
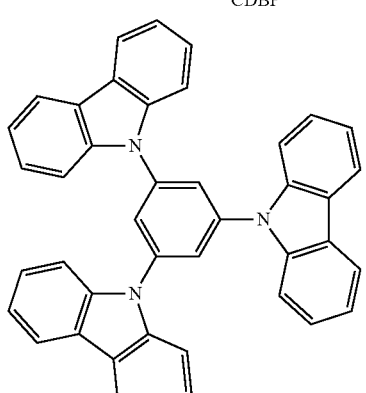
TCP
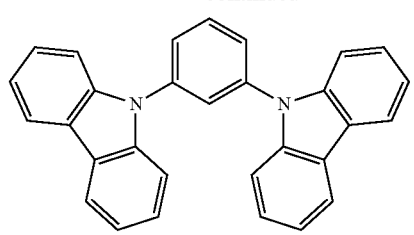
mCP
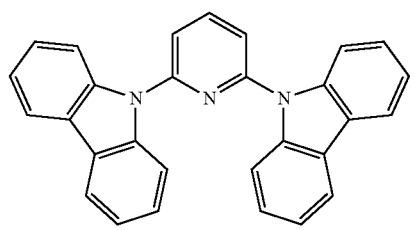
H50
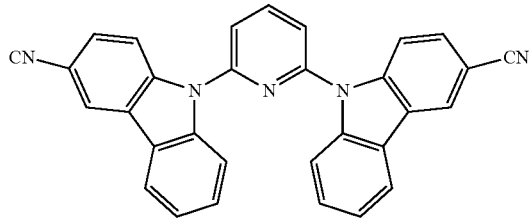
H51
The electron transport material may include, for example, BCP, Bphen, Alq$_3$, Balq, TAZ, NTAZ, or a combination thereof.
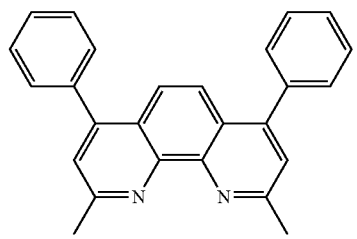
BCP
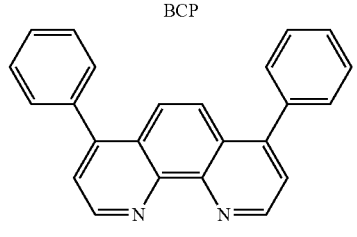
Bphen

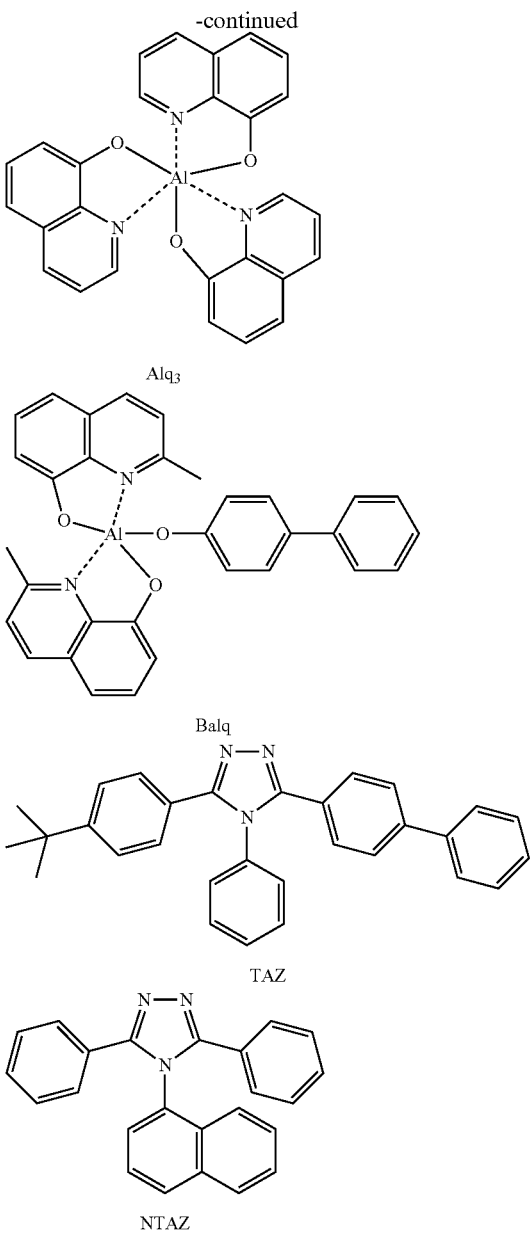

Alq3

Balq

TAZ

NTAZ

Meanwhile, the interlayer 15 may include an insulating material that is used for a pixel defining layer, an electrolyte that is used for various batteries, air and an inert gas such as argon gas, depending on the purpose.

When a voltage is applied to the first conductive layer 11 of each of the light-emitting devices 10 and 20 of FIGS. 1 and 2, light may be emitted from each of the light-emitting groups 13 chemically bonded to the surface of the first conductive layer 11.

In an embodiment, according to a change in a voltage (for example, a change in a voltage intensity) applied to the first conductive layer 11 of each of the light-emitting devices 10 and 20 of FIGS. 1 and 2, the electron density of the light-emitting group 13 may be changed.

In an embodiment, according to a change in the voltage applied to the first conductive layer 11 of each of the light-emitting devices 10 and 20 of FIGS. 1 and 2, the wavelength of light emitted from the light-emitting group 13 may be changed.

In an embodiment, according to a continuous change in the voltage applied to the first conductive layer 11 of each of the light-emitting devices 10 and 20 of FIGS. 1 and 2, the wavelength of light emitted from the light-emitting group 13 may be continuously changed.

Since in the light-emitting devices 10 and 20 of FIGS. 1 and 2, the light-emitting group 13 is chemically directly bonded to the an atom on the surface of the first conductive layer 11, by controlling the voltage applied to the first conductive layer 11, the intensity and/or maximum emission wavelength of light emitted from the light-emitting group 13 may be easily controlled, without a change in the structure of the light-emitting devices 10 and 20 and/or the chemical structure of the light-emitting group 13. That is, by controlling the voltage applied to the first conductive layer 11, not by changing the chemical structure of the light-emitting group 13 and/or the structure of each of the light-emitting devices 10 and 20, light emitted from the light-emitting devices 10 and 20 may be controlled. This is distinguishable from light-emitting devices in which luminescent compound molecules are randomly placed on a certain electrode through a deposition method (for example, vacuum deposition method, etc.) and/or a coating method (for example, a spin coating method, a laser printing method, etc.), and thus, even when the voltage applied to the electrode is changed, the intensity and/or maximum emission wavelength of light emitted from luminescent compound molecules are not able to be changed. Accordingly, the light-emitting devices 10 and 20 may be applicable in various ways to various displays, light sources, and monitors.

In addition, in manufacturing the light-emitting devices 10 and 20 that emit light having a certain level of color purity, half-width and/or maximum emission wavelength, there is no need to scarify the heat resistance and/or electrical stability of the light-emitting group 13. In other words, the light-emitting group 13 having excellent heat resistance and electrical stability is chemically bonded to an atom on the surface of first conductive layer 11, and then, the level of color purity, half-width and/or maximum emission wavelength of light emitted from the light-emitting group 13 may be adjusted by controlling the voltage applied to the first conductive layer 11. Accordingly, without sacrificing the heat resistance and/or electrical stability of the light-emitting group 13 that may affect the lifespan of the light-emitting devices 10 and 20 of FIGS. 1 and 2, the light emitted from the light-emitting devices 10 and 20 may be easily controlled.

A method of manufacturing the light-emitting device 10 of FIG. 1 includes:

providing a first conductive layer 11, and chemically bonding the light-emitting group 13 represented by Formula 1 to an atom on the surface of the first conductive layer 11 by bringing the first conductive layer 11 into contact with a compound represented by Formula 1A:

$$A_4\text{-}A_3\text{-}(A_1)_{m1}\text{-}(A_2)_{m2} \qquad \text{Formula 1A}$$

$$*\text{-}A_3\text{-}(A_1)_{m1}\text{-}(A_2)_{m2} \qquad \text{Formula 1}$$

wherein, in Formulae 1A and 1, $A_4$ is a moiety,

\* indicates a chemical binding site to an atom on the surface of the first conductive layer 11, $A_3$ is an atom bonded to an atom on the surface of the first conductive layer 11, $A_1$ is a linking group, $A_2$ is a light-emitting moiety, and m1 and m2 are each independently an integer from 1 to 10, wherein, when m1 is 2 or more, two or more of $A_1(s)$ may be identical to or different from each other, and when m2 is 2 or more, two or more of $A_2(s)$ may be identical to each other or different from each other.

*, $A_3$, $A_1$, $A_2$, m1, and m2 in Formulae 1A and 1 are each the same as described above.

In an embodiment, $A_4$ in Formula 1A may be hydrogen or a substituted or unsubstituted $C_1$-$C_{60}$ alkyl group.

In an embodiment, the compound represented by Formula 1A may be a phosphorescent luminescent compound, a fluorescent luminescent compound, or a quantum dot, in which hydrogen is substituted with a hydroxyl group (—OH) or a thiol group (—SH).

In an embodiment, the compound represented by Formula 1A may be, for example, Compounds PD80A, PD86A, D1-19A or FD(17)A:

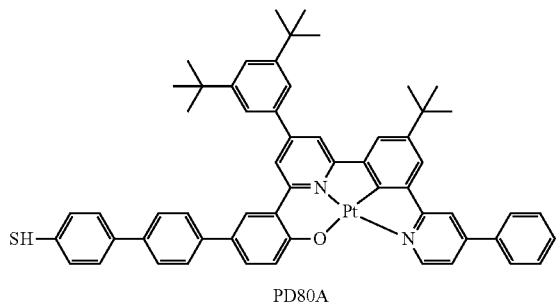

PD80A

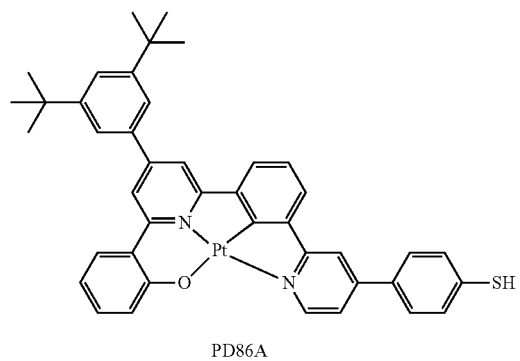

PD86A

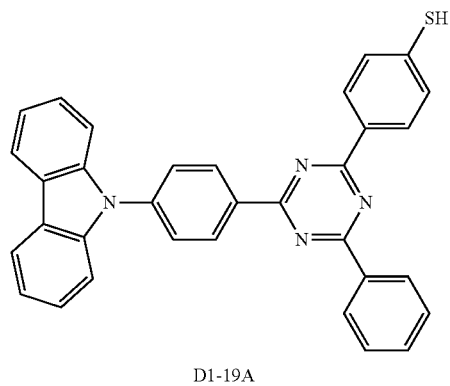

D1-19A

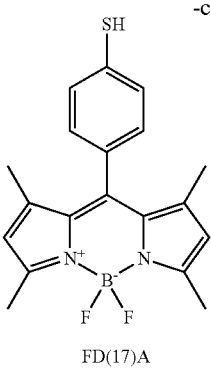

FD(17)A

In an embodiment, the process of bringing the first conductive layer 11 to be in contact with the compound represented by Formula 1A so as to chemically bond the light-emitting group 13 represented by Formula 1 to an atom on the surface of the first conductive layer 11, may be performed by a metal (for example, Au)-thiol reaction, in the case where in Formula 1A, $A_3$ is S and $A_4$ is hydrogen.

Meanwhile, the interlayer 15 of FIG. 2 may be formed on the first conductive layer 11 to which the light-emitting group 13 is chemically bonded, by using various methods for example, a vacuum deposition method, a spin coating method, a cast method, and an LB method.

In the case of forming the interlayer 15 by a vacuum deposition method, the deposition conditions differ depending on a compound for forming the interlayer 15, the structure and thermal characteristics of the interlayer 15, etc. The deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the interlayer 15 is formed using spin coating, coating conditions may vary according to a compound for forming the interlayer 15, the structure and thermal properties of the interlayer 15, etc. For example, a coating speed may be from about 2,000 rpm to about 5,000 rpm, and a temperature at which a heat treatment is performed to remove a solvent after coating may be from about 80° C. to about 200° C.

In an embodiment, in the interlayer 15 of the light-emitting device 20, a spacer is arranged between the first conductive layer 11 and the second conductive layer 19 to secure a gap, and then the gap between the first conductive layer 11 and the second conductive layer 19 may be filled with the insulating material, electrolyte, air or inert gas by capillary phenomenon.

The operating method of the light-emitting devices 10 and 20 of FIGS. 1 and 2 may include controlling a voltage applied to the first conductive layer 11 of the light-emitting devices 10 and 20. In this manner, the intensity and/or maximum emission wavelength of light emitted from light-emitting group 13 of light-emitting devices 10 and 20 may be controlled.

For example, the controlling of the voltage applied to the first conductive layer 11 of the light-emitting devices 10 and 20 may include continuously or discontinuously changing the voltage applied to the first conductive layer of the light-emitting device.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, a propoxy group, a butoxy group, and a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_1$-$C_{60}$ alkylthio group" as used herein refers to a monovalent group represented by —$SA_{102}$ (wherein $A_{102}$ is the $C_1$-$C_{60}$ alkyl group), and non-limiting examples thereof include a methylthio group, an ethylthio group, and an iso-propylthio group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a saturated monovalent cyclic group having 1 to 10 carbon atoms and at least one heteroatom of N, O, P, Si, S, Se, Ge, and B as a ring-forming atom. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom of N, O, P, Si, S, Se, Ge, and B as a ring-forming atom, 1 to 10 carbon atoms, and at least one double bond in its ring and that is not aromatic. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_1$-$C_{60}$ heteroaryl group" as used herein refers to a monovalent group having a heterocyclic aromatic system having at least one heteroatom of N, O, P, Si, S, Se, Ge, and B as a ring-forming atom and 1 to 60 carbon atoms. The term "$C_1$-$C_{60}$ heteroarylene group" as used herein refers to a divalent group having a heterocyclic aromatic system having at least one heteroatom of N, O, P, Si, S, Se, Ge and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_6$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, S, Se, Ge, and B and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, (each unsubstituted or substituted with at least one $R_{10a}$).

The term "$C_1$-$C_{30}$ heterocyclic group" as used herein refers to saturated or unsaturated cyclic group including 1 to 30 carbon atoms and at least one heteroatom selected from N, O, P, Si, S, Se, Ge, and B as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, (each unsubstituted or substituted with at least one $R_{10a}$).

Examples of the "$C_5$-$C_{30}$ carbocyclic group" and the "$C_1$-$C_{30}$ heterocyclic group" as used herein include i) a third ring, ii) a fourth ring, iii) a condensed ring in which at least two third rings are condensed, iv) a condensed ring in which at least two fourth rings are condensed, or v) a condensed ring in which at least one third ring and at least one fourth ring are condensed, the third ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the fourth ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The "deuterated $C_2$-$C_{20}$ alkyl group" and the "deuterium-containing $C_1$-$C_{20}$ alkyl group" as used herein may respectively be a $C_2$-$C_{20}$ alkyl group or $C_1$-$C_{20}$ alkyl group, each substituted with at least one deuterium. Examples of the "deuterated $C_1$ alkyl group (i.e., a deuterated methyl group)" may include —$CD_3$, —$CD_2H$, and —$CDH_2$. The "deuterated $C_2$-$C_{20}$ alkyl group" and the "deuterium-containing $C_1$-$C_{20}$ alkyl group" may respectively be: i) a fully deuterated $C_2$-$C_{20}$ alkyl group (or fully deuterated $C_1$-$C_{20}$ alkyl group) in which all hydrogen atoms are substituted with deuterium atoms; or ii) a partially deuterated $C_2$-$C_{20}$alkyl group (or partially deuterated $C_1$-$C_{20}$ alkyl group), in which some of hydrogen atoms are substituted with deuterium atoms.

The "($C_1$-$C_{20}$ alkyl)'X' group" refers to a 'X' group substituted with at least one $C_1$-$C_{20}$ alkyl group. For example, The "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

Substituents of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or $C_1$-$C_{60}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

As used herein, the number of carbons in each group that is substituted (e.g., $C_1$-$C_{60}$) excludes the number of carbons in the substituent. For example, a $C_1$-$C_6$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

Hereinafter, a light-emitting device will be described in detail through Synthesis Examples and Examples.

EXAMPLES

Synthesis Example 1 (Compound PD86A)

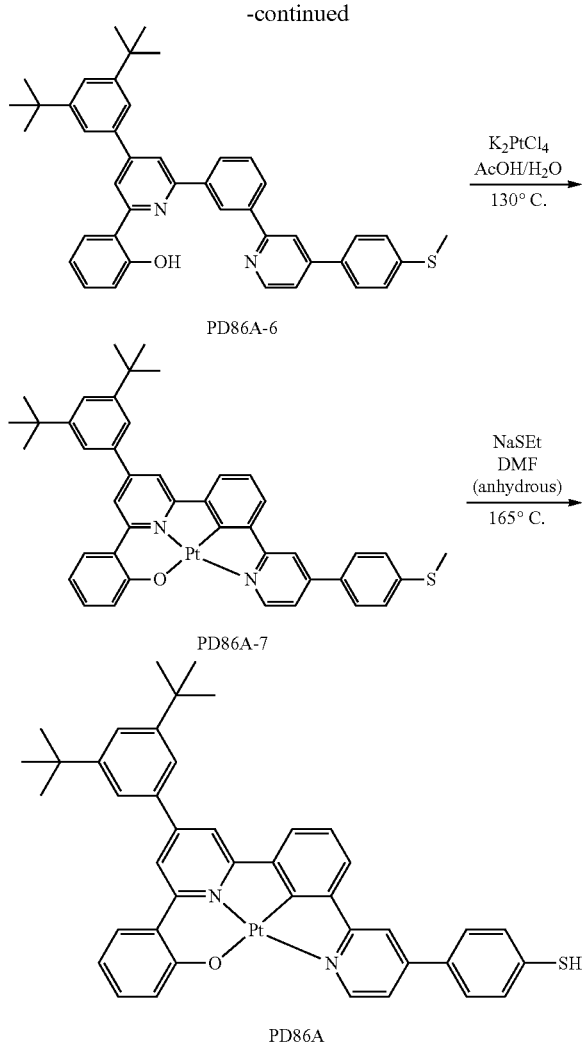

Synthesis of Intermediate PD86A-1

6.70 g (24.5 mmol) of 2,6-dichloro-4-(4,4,5,5-tetramethyl-1,3,2-dioxaborolan-2-yl)pyridine, 7.90 g (29.4 mmol) of 1-bromo-3,5-di-tert-butylbenzene, 1.41 g (1.22 mmol) of Pd(PPh$_3$)$_4$, and 10.1 g (73.4 mmol) of potassium carbonate were added to a mixture including 80 mL of THF (tetrahydrofuran) and 40 mL of water, and then, stirred while refluxing for 24 hours. After the reaction was completed, the resultant solution was cooled to room temperature, an aqueous solution layer was removed therefrom through extraction, the organic layer was filtered through silica gel, and the filtrate obtained by filtration was concentrated under reduced pressure. The product obtained therefrom was separated by silica gel column chromatography to obtain 2.40 g (yield of 29%) of the target compound Intermediate PD86A-1.

LC-MS (calculated: 335.12 g/mol, found: M+1=336 g/mol).

Synthesis of Intermediate PD86A-2

2.30 g (6.84 mmol) of Intermediate PD86A-1, 1.00 g (7.18 mmol) of (2-hydroxyphenyl)boronic acid, 0.553 g (0.479 mmol) of Pd(PPh$_3$)$_4$, and 3.78 g (27.4 mmol) of potassium carbonate were added to a mixture including 25 mL of THF and 12 mL of water, and then, stirred while refluxing for 16 hours. After the reaction was completed, the resultant solution was cooled to room temperature, an aqueous solution layer was removed therefrom through extraction, the organic layer was filtered through silica gel, and the filtrate obtained was concentrated under reduced pressure. The product obtained therefrom was separated by silica gel column chromatography to obtain 2.10 g (yield of 78%) of Intermediate PD86A-2.

LC-MS (calculated: 393.19 g/mol, found: M+1=394 g/mol).

Synthesis of Intermediate PD86A-3

5.00 g (29.8 mmol) of 4-(methylthio)phenylboronic acid, 8.45 g (29.8 mmol) of 2-bromo-4-iodopyridine, 3.44 g (2.98 mmol) of Pd(PPh$_3$)$_4$, and 12.3 g (89.3 mmol) of potassium carbonate were added to a mixture including 100 mL of THF and 50 mL of water, and then stirred while refluxing for 24 hours. After the reaction was completed, the resultant solution was cooled to room temperature, an aqueous solution layer was removed therefrom through extraction, the organic layers was filtered through silica gel, and the filtrate obtained was concentrated under reduced pressure. The product obtained therefrom was separated by silica gel column chromatography to obtain 6.30 g (yield of 76%) of Intermediate PD86A-3.

LC-MS (calculated: 278.97 g/mol, found: M+1=280 g/mol).

Synthesis of Intermediate PD86A-4

6.00 g (21.4 mmol) of Intermediate PD86A-3, 4.73 g (23.6 mmol) of (3-bromophenyl)boronic acid, 1.24 g (1.07 mmol) of Pd(PPh$_3$)$_4$, and 8.88 g (64.2 mmol) of potassium carbonate were added to a mixture including 70 mL of THF and 35 mL of water, and then, stirred while refluxing for 4 hours. After the reaction was completed, the resultant solution was cooled to room temperature, an aqueous solution layer was removed therefrom through extraction, the organic layer was filtered through silica gel, and the filtrate obtained was concentrated under reduced pressure. The product obtained therefrom was separated by silica gel column chromatography to obtain 5.40 g (yield of 71%) of Intermediate PD86A-4.

LC-MS (calculated: 355.00 g/mol, found: M+1=356 g/mol).

Synthesis of Intermediate PD86A-5

1.50 g (4.21 mmol) of Intermediate PD86A-4 was dissolved in 20 mL of THF under nitrogen substitution condition, cooled to at a temperature of −78° C., and then 3.16 mL (1.6 M solution in hexane, 5.05 mmol) of n-BuLi (n-butyl lithium) was slowly added thereto, followed by 30 minutes of stirring. Then, 1.72 mL (8.42 mmol) of 2-isopropoxy-4,4,5,5-tetramethyl-1,3,2-dioxaborolane was slowly added thereto, and 30 minutes after, the temperature thereof was raised to room temperature and stirred for 12 hours. After completion of the reaction, an organic layer was separated therefrom through extraction and concentrated under reduced pressure to obtain the target compound, Intermediate PD86A-5, which was then used in the next reaction without further purification.

Synthesis of Intermediate PD86A-6

1.20 g (3.05 mmol) of Intermediate PD86A-2, 1.35 g (3.35 mmol) of Intermediate PD86A-5, 0.246 g (0.213 mmol) of Pd(PPh$_3$)$_4$, 1.26 g (9.14 mmol) of potassium carbonate, and 0.157 g (0.914 mmol) of barium hydroxide were added to a mixture including 12 mL of THF and 6 mL of water, and then, stirred while refluxing for 18 hours. After the reaction was completed, the solution was cooled to room temperature, the aqueous solution layer was removed through extraction, the organic layer was filtered through silica gel, and the filtrate obtained was concentrated under reduced pressure. The product obtained therefrom was separated by silica gel column chromatography to obtain, as a target compound, 1.05 g (yield of 54%) of Intermediate PD86A-6.

LC-MS (calculated: 634.30 g/mol, found: M+1=635 g/mol).

Synthesis of Intermediate PD86A-7

0.150 g (0.242 mmol) of Intermediate PD86A-6 and 0.120 g (0.290 mmol) of K$_2$PtCl$_4$ were added to a mixture including 3 mL of acetic acid (AcOH) and 0.5 mL of water, and then stirred while refluxing for 20 hours. After completion of the reaction, the temperature was decreased to room temperature, thereby obtaining a solid, which was then washed with water to obtain, as a target compound, 0.041 g (yield of 21%) of Intermediate PD86A-7.

LC-MS (calculated: 827.25 g/mol, found: M+1=828 g/mol).

Synthesis of Compound PD86A 40 mg (0.0484 mmol) of Intermediate PD86A-7 and 40 mg (80%, 0.386 mmol) of sodium ethanethiolate (NaSEt) were added to 1 mL of DMF (dimethylforamide) solvent, and then stirred while refluxing for 20 hours. After the reaction was completed, the temperature was decreased to room temperature and aq.NH$_4$Cl solution was added thereto to separate the resulting solid by silica gel column chromatography, thereby obtaining Compound PD86A (6 mg, yield of 15%).

LC-MS (calculated: 813.24 g/mol, found: M+1=814 g/mol).

Synthesis Example 2 (Compound D1-19A)

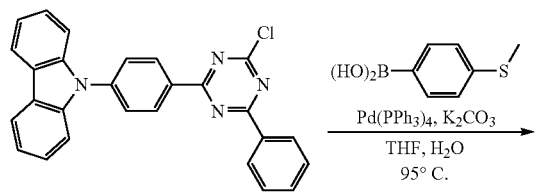

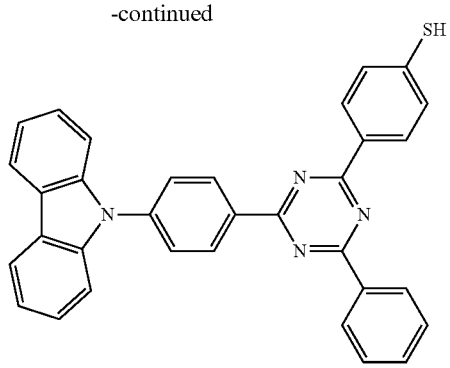

D1-19A

Synthesis of Intermediate D1-19A-1

5.00 g (11.6 mmol) of 9-(4-(4-chloro-6-phenyl-1,3,5-triazin-2-yl)phenyl)-9H-carbazole, 2.14 g (12.7 mmol) of 4-(methylthio)phenylboronic acid, 1.34 g (1.15 mmol) of Pd(PPh$_3$)$_4$, and 4.79 g (34.7 mmol) of potassium carbonate were added to a mixture including 40 mL of THF and 20 mL of water, and then stirred while refluxing for 12 hours. After the reaction was completed, the resultant solution was cooled to room temperature, an aqueous solution layer was removed therefrom through extraction, and the filtrate obtained by filtration under reduced pressure with silica gel was concentrated under reduced pressure. The product obtained therefrom was separated by silica gel column chromatography to obtain, as a target compound, 4.73 g (yield of 79%) of Intermediate D1-19A-1.

LC-MS (calculated: 520.17 g/mol, found: M+1=521 g/mol).

Synthesis of Compound D1-19A 1.00 g (1.92 mmol) of Intermediate D1-19A-1 and 1.62 g (80%, 15.4 mmol) of sodium ethanethiolate were added to 10 mL of DMF solvent, and then stirred while refluxing for 24 hours. After the reaction was completed, the mixture was cooled to room temperature and placed in an ice bath, and 120 mL of 3N HCl solution was added thereto and the solid generated therefrom was filtered. The solid was then purified through recrystallization to obtain Compound D1-19A (0.41 g, yield of 42%).

LC-MS (calculated: 506.16 g/mol, found: M+1=507 g/mol).

Synthesis Example 3 (Compound FD(17)A)

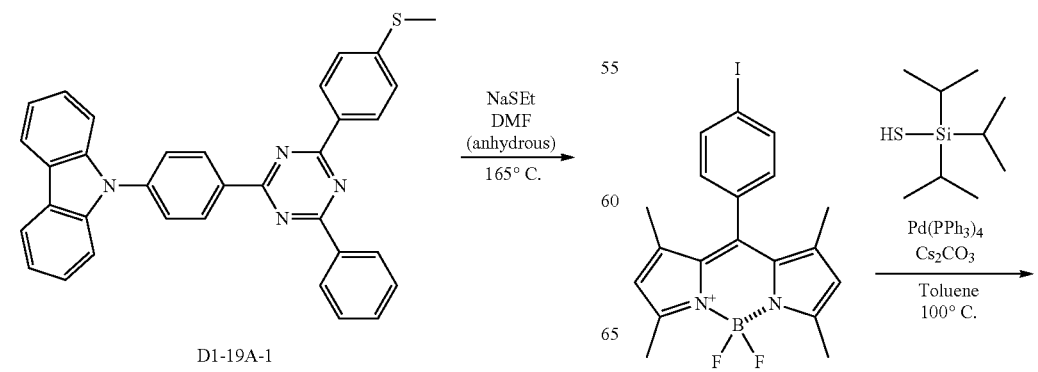

D1-19A-1

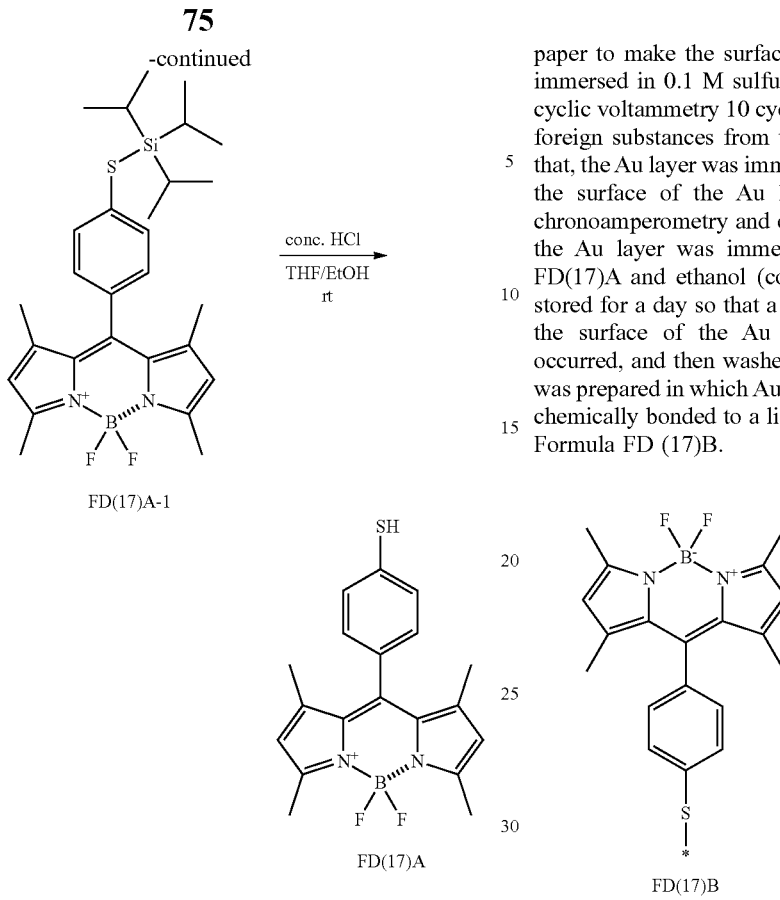

Synthesis of Intermediate FD(17)A-1

0.420 g (0.933 mmol) of [1-[(3,5-dimethyl-1H-pyrrol-2-yl)(3,5-dimethyl-2H-pyrrol-2-ylidene)methyl]-4-iodobenzene](difluoroborane), 0.249 g (1.31 mmol) of triisopropylsilanethiol, 0.065 g (0.0560 mmol) of Pd(PPh$_3$)$_4$, and 0.426 g (1.40 mmol) of cesium carbonate were added to 10 mL of toluene, and then, stirred while refluxing at a temperature of 100° C. for 20 hours. After the reaction was completed, the temperature was decreased to room temperature, and 10 mL of aq.NH$_4$Cl solution was added thereto, and an aqueous solution layer was removed through extraction, followed by concentration of the organic layer under reduced pressure. The product obtained therefrom was separated by silica gel column chromatography to obtain, as a target compound, Intermediate FD(17)A-1 0.40 g (yield of 82%).

LC-MS (calculated: 512.27 g/mol, found: M+1=513 g/mol).

Synthesis of Compound FD(17)A 0.30 g (0.586 mmol) of Intermediate FD(17)A-1 was added to a mixture including 3 ml of THF and 3 mL of EtOH (ethanol), and then, 0.20 mL (2.34 mmol) of conc. HCl was added thereto, followed by 5 hours of stirring. After the reaction was completed, the mixture was concentrated under reduced pressure to remove the solvent therefrom, dissolved in DCM (dichloromethane), filtered, and then concentrated under reduced pressure. The product was separated by silica gel column chromatography, thereby obtaining Compound FD(17)A (0.125 g, yield of 60%).

LC-MS (calculated: 356.13 g/mol, found: M+1=357 g/mol).

Example 1

An Au layer was immersed in a piranha solution for 1 hour, taken out, washed, and then treated with polishing paper to make the surface thereof to be smooth, and then immersed in 0.1 M sulfuric acid solution and subjected to cyclic voltammetry 10 cycles, thereby completely removing foreign substances from the surface of the Au layer. After that, the Au layer was immersed in 0.15 M KCl solution, and the surface of the Au layer was further cleaned using chronoamperometry and cyclic voltammetry. Subsequently, the Au layer was immersed in a mixture of compound FD(17)A and ethanol (concentration of 5 mM), and then stored for a day so that a chemical reaction between Au on the surface of the Au layer and Compound FD(17)A occurred, and then washed. Thus, a light-emitting device 1 was prepared in which Au on the surface of the Au layer was chemically bonded to a light-emitting group represented by Formula FD (17)B.

\* in Formula FD(17)B indicates a chemical binding site with Au on the surface of the Au layer.

Evaluation Example 1

By using an ISC PC1 spectrofluorometer equipped with a Xenon lamp, the photoluminescence (PL) spectrum (at room temperature) of the light-emitting device 1 was measured while the applied voltage was changed as shown in Table 1. Accordingly, the maximum emission wavelength and color purity (CIE x and CIE y coordinates) of the light-emitting device depending on the applied voltage were evaluated. Results are shown in Table 1.

TABLE 1

| Applied voltage (V) | Maximum emission wavelength (nm) | CIEx | CIEy |
|---|---|---|---|
| 0 V | 495 | 0.178 | 0.502 |
| −1 V | 501 | 0.240 | 0.523 |
| −3 V | 512 | 0.276 | 0.589 |

From Table 1, it can be seen that the light-emitting device 1 can emit light having various wavelengths and color purity according to applied voltage.

Since the light-emitting group of the light-emitting device is chemically bonded to an atom on the surface of the first conductive layer, the intensity and/or maximum emission wavelength of light emitted from the light-emitting group can be arbitrarily changed by controlling the voltage applied to the first conductive layer without a change in the structure of the light-emitting device and/or the chemical structure of the light-emitting group. Accordingly, the light-emitting device can be variously applied to various displays, light sources, monitors, and the like.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first conductive layer; and
a light-emitting group represented by Formula 1, wherein the light-emitting group is chemically bonded to an atom on a surface of the first conductive layer:

$$*\text{-}A_3\text{-}(A_1)_{m1}\text{-}(A_2)_{m2} \qquad \text{Formula 1}$$

wherein, in Formula 1,
* indicates a chemical binding site to an atom on the surface of the first conductive layer,
$A_3$ is an atom bonded to the atom on the surface of the first conductive layer,
$A_1$ is a linking group,
$A_2$ is a light-emitting moiety, and
m1 and m2 are each independently an integer from 1 to 10, wherein, when m1 is 2 or more, two or more of $A_1$ are identical to or different from each other, and when m2 is 2 or more, two or more of $A_2$ are identical to each other or different from each other,
wherein a monolayer comprising a plurality of light-emitting groups is located on the surface of the first conductive layer,
wherein the monolayer comprising the plurality of light-emitting groups is in direct contact with the surface of the first conductive layer, and
wherein a thickness of the monolayer is from about 0.1 nm to about 5.0 nm.

2. The light-emitting device of claim 1, wherein the first conductive layer comprises magnesium (Mg), calcium (Ca), scandium (Sc), yttrium (Y), lanthanum (La), actinium (Ac), titanium (Ti), zirconium (Zr), hafnium (Hf), cerium (Ce), vanadium (V), niobium (Nb), tantalum (Ta), chromium (Cr), molybdenum (Mo), tungsten (W), neodymium (Nd), manganese (Mn), rhenium (Re), iron (Fe), cobalt (Co), nickel (Ni), copper (Cu), silver (Ag), gold (Au), zinc (Zn), aluminum (Al), gallium (Ga), indium (In), thallium (Tl), tin (Sn), bismuth (Bi), boron (B), silicon (Si), germanium (Ge), arsenic (As), antimony (Sb), tellurium (Te), carbon, nitrogen, oxygen, or any combination thereof.

3. The light-emitting device of claim 1, wherein the monolayer is a self-assembled monolayer.

4. The light-emitting device of claim 1, wherein * in Formula 1 indicates a chemical binding site to a metal, a metalloid, carbon, nitrogen, or oxygen on the surface of the first conductive layer.

5. The light-emitting device of claim 1, wherein the first conductive layer comprises silver (Ag), gold (Au), zinc (Zn), aluminum (Al), gallium (Ga), indium (In), thallium (Tl), tin (Sn), or any combination thereof, and
* in Formula 1 indicates a chemical binding site with silver (Ag), gold (Au), zinc (Zn), aluminum (Al), gallium (Ga), indium (In), thallium (Tl), or tin (Sn) on the surface of the first conductive layer.

6. The light-emitting device of claim 1, wherein $A_3$ of Formula 1 is O or S.

7. The light-emitting device of claim 1, wherein $A_1$ of Formula 1 is a single bond, a substituted or unsubstituted $C_2$-$C_{60}$ alkylene group, a substituted or unsubstituted $C_2$-$C_{60}$ alkynylene group, a substituted or unsubstituted $C_2$-$C_{60}$ alkenylene group, a substituted or unsubstituted $C_5$-$C_{30}$ carbocyclic group, or a substituted or unsubstituted $C_2$-$C_{30}$ heterocyclic group.

8. The light-emitting device of claim 1, wherein $A_2$ in Formula 1 is a monovalent group derived from a phosphorescent luminescent compound, a fluorescent luminescent compound, or a quantum dot.

9. The light-emitting device of claim 1, wherein $A_2$ in Formula 1 is a monovalent group derived from a transition metal-containing organometallic compound.

10. The light-emitting device of claim 1, wherein $A_2$ of Formula 1 is a monovalent group derived from a fluorescent luminescent compound, wherein the fluorescent luminescent compound is a prompt-fluorescence luminescent compound or a delayed-fluorescence luminescent compound.

11. The light-emitting device of claim 1, further comprising a second conductive layer facing the first conductive layer,
wherein $A_2$ of Formula 1 faces the second conductive layer.

12. The light-emitting device of claim 11, further comprising an interlayer located between the first conductive layer and the second conductive layer, wherein
the interlayer comprises:
a hole transport material, a light-emitting material, an electron transport material, or a combination thereof; or
an insulating material, an electrolyte, air, or inert gas.

13. The light-emitting device of claim 1, wherein an electron density of the light-emitting group changes according to a change in a voltage applied to the first conductive layer.

14. The light-emitting device of claim 1, wherein a wavelength of light emitted from the light-emitting group changes according to a change in a voltage applied to the first conductive layer.

15. The light-emitting device of claim 1, wherein a wavelength of light emitted from the light-emitting group continuously changes according to a continuous change in a voltage applied to the first conductive layer continuously.

16. A method of manufacturing a light-emitting device, the method comprising:
providing a first conductive layer; and
chemically bonding a light-emitting group represented by Formula 1 to an atom on a surface of the first conductive layer by bringing the first conductive layer into contact with a compound represented by Formula 1A:

$$A_4\text{-}A_3\text{-}(A_1)_{m1}\text{-}(A_2)_{m2} \qquad \text{Formula 1A}$$

$$*\text{-}A_3\text{-}(A_1)_{m1}\text{-}(A_2)_{m2} \qquad \text{Formula 1}$$

wherein, in Formulae 1A and 1,
$A_4$ is a moiety,
* indicates a chemical binding site to an atom on the surface of the first conductive layer,
$A_3$ is an atom bonded to an atom on the surface of the first conductive layer,
$A_1$ is a linking group,
$A_2$ is a light-emitting moiety, and
m1 and m2 are each independently an integer from 1 to 10, wherein, when m1 is 2 or more, two or more of $A_1$ are identical to or different from each other, and when m2 is 2 or more, two or more of $A_2$ are identical to each other or different from each other, wherein a monolayer comprising a plurality of light-emitting groups is located on the surface of the first conductive layer, wherein the monolayer comprising the plurality of light-emitting groups is in direct contact with the surface of the first conductive layer, and wherein a thickness of the monolayer is from about 0.1 nm to about 5.0 nm.

17. An operating method of a light-emitting device, the operating method comprising controlling a voltage applied to the first conductive layer of the light-emitting device of claim 1.

18. The operating method of claim 17, wherein the controlling of the voltage applied to the first conductive layer of the light-emitting device comprises continuously or discontinuously changing the voltage applied to the first conductive layer of the light-emitting device.

* * * * *